(12) United States Patent
Hayashi

(10) Patent No.: US 11,203,488 B2
(45) Date of Patent: Dec. 21, 2021

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: KOKUSAI ELECTRIC CORPORATION, Tokyo (JP)

(72) Inventor: Akinari Hayashi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/793,678

(22) Filed: Feb. 18, 2020

(65) Prior Publication Data

US 2020/0180865 A1   Jun. 11, 2020

Related U.S. Application Data

(63) Continuation of application No. 15/988,849, filed on May 24, 2018, now Pat. No. 10,703,565, which is a
(Continued)

(51) Int. Cl.
*B65G 1/137* (2006.01)
*H01L 21/677* (2006.01)
*H01L 21/67* (2006.01)

(52) U.S. Cl.
CPC .......... *B65G 1/137* (2013.01); *H01L 21/6773* (2013.01); *H01L 21/67265* (2013.01);
(Continued)

(58) Field of Classification Search
CPC combination set(s) only.
See application file for complete search history.

(56) References Cited

U.S. PATENT DOCUMENTS 6,216,058 B1 * 4/2001 Hosek .................... B25J 9/1664
                                                        700/245
6,582,174 B1   6/2003 Hayashi
(Continued)

FOREIGN PATENT DOCUMENTS

JP   2000-091398 A   3/2000
JP   2000-124301 A   4/2000
(Continued)

OTHER PUBLICATIONS

Japanese Office Action dated Feb. 4, 2021 for Japanese Patent Application No. 2020-013815.

*Primary Examiner* — Kyle O Logan
(74) *Attorney, Agent, or Firm* — Volpe Koenig

(57) ABSTRACT

A substrate processing apparatus includes a plurality of placement parts on which a substrate container is placed, a driving part configured to move the plurality of placement parts, a transport mechanism configured to load the substrate container into one of the plurality of placement parts and to unload the substrate container from one of the plurality of placement parts, and a controller configured to control the driving part and the transport mechanism so that by raising or lowering the transport mechanism while keeping a support of the transport mechanism unmoved in an initial position, the substrate container is delivered from one of the plurality of placement parts to the support of the transport mechanism, and the substrate container is delivered from the support of the transport mechanism to one of the plurality of placement parts.

18 Claims, 12 Drawing Sheets

Related U.S. Application Data continuation of application No. PCT/JP2015/083408, filed on Nov. 27, 2015.

(52) U.S. Cl.
CPC .. *H01L 21/67769* (2013.01); *H01L 21/67775* (2013.01); *B65G 2201/0297* (2013.01)

(56) References Cited

U.S. PATENT DOCUMENTS

| | | | | |
|---|---|---|---|---|
| 2003/0108415 A1* | 6/2003 | Hosek | .................... | B25J 9/1664 414/783 |
| 2004/0249509 A1* | 12/2004 | Rogers | ............... | G05B 19/4103 700/245 |
| 2005/0011294 A1* | 1/2005 | Hashimoto | ................ | B25J 9/06 74/490.01 |
| 2006/0182536 A1* | 8/2006 | Rice | .................. | H01L 21/67178 414/217 |
| 2008/0152466 A1* | 6/2008 | Bonora | ................ | B65G 1/0407 414/222.07 |
| 2011/0301739 A1* | 12/2011 | Kataoka | ............. | G05B 19/4183 700/108 |
| 2012/0093620 A1 | 4/2012 | Murata et al. | | |

FOREIGN PATENT DOCUMENTS

| | | |
|---|---|---|
| JP | 2000-216212 A | 8/2000 |
| JP | 2009-010009 A | 1/2009 |
| JP | 2011-006222 A | 1/2011 |
| JP | 2011-181817 A | 9/2011 |
| KR | 10-2011-0134273 A | 12/2011 |

* cited by examiner

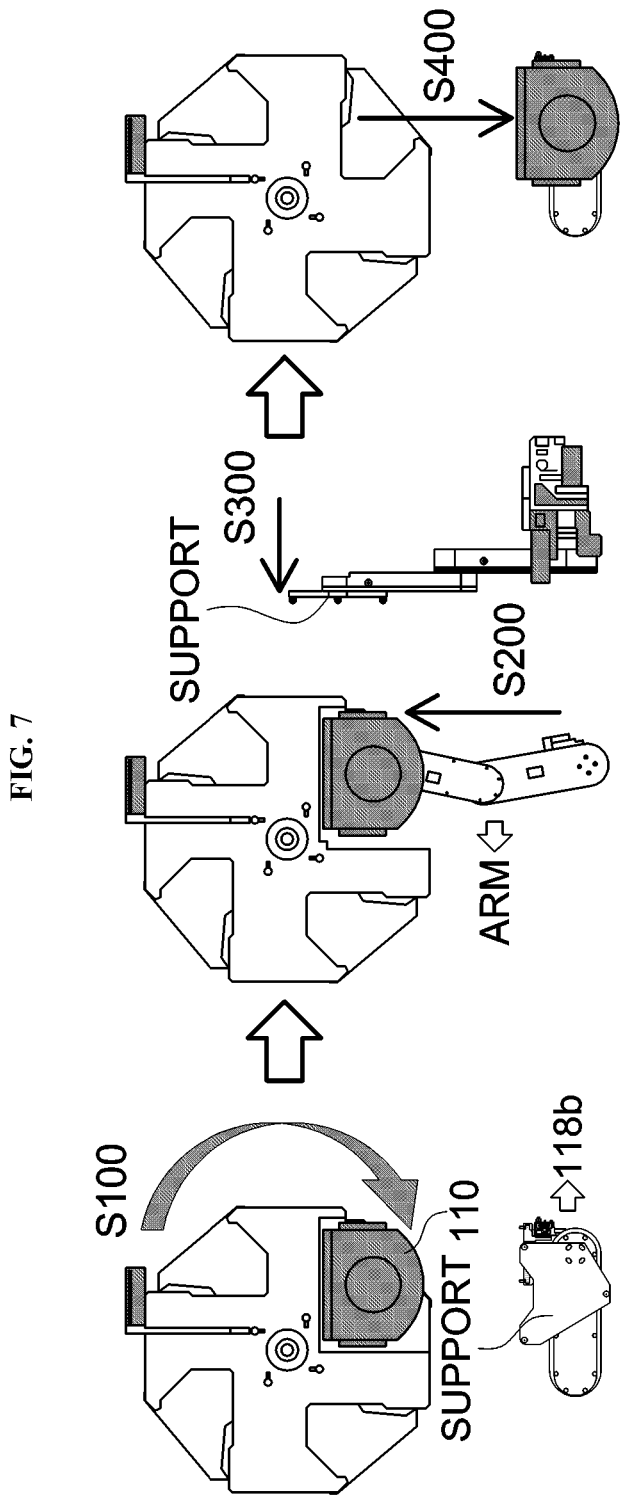

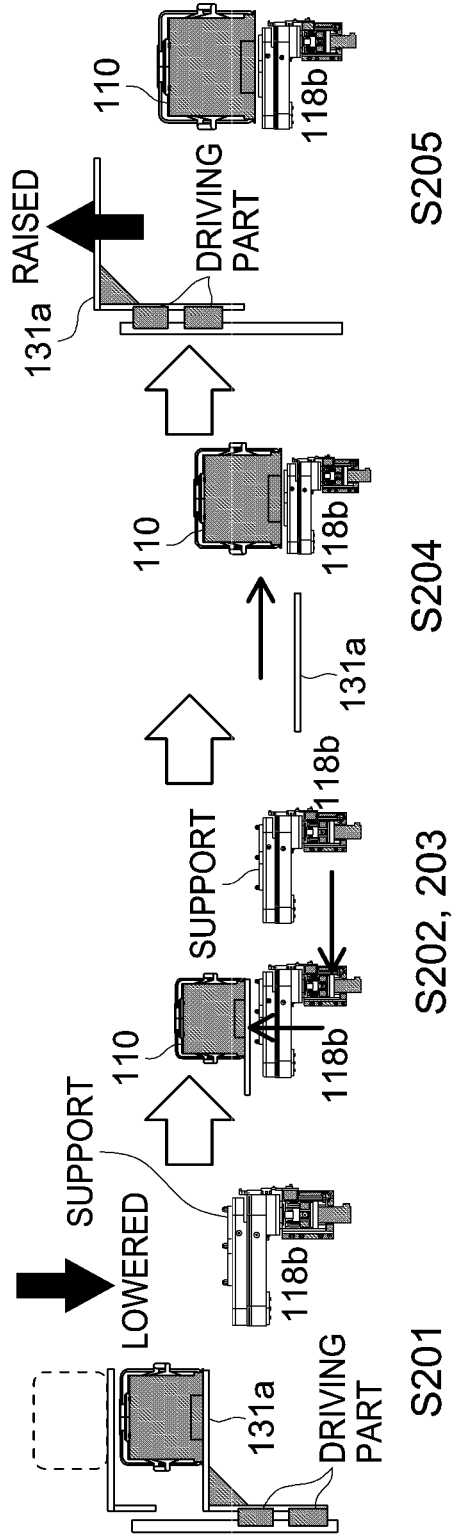

US 11,203,488 B2

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application is a continuation of U.S. patent application Ser. No. 15/988,849 and claims priority under 35 U.S.C. § 119 of International Application No. PCT/JP2015/083408, filed on Nov. 27, 2015, in the WIPO, the entire contents of which are hereby incorporated by reference.

BACKGROUND

1. Field

The present disclosure relates to a substrate processing apparatus, a substrate container transport system and an operation mechanism.

2. Description of the Related Art

In a semiconductor manufacturing apparatus, which is a type of substrate processing apparatus, a substrate container (hereinafter also referred to as FOUP: Front Opening Unified Pod) containing substrates (hereinafter also referred to as "wafers") for the next substrate processing is usually prepared in advance inside the apparatus in order to increase the operation efficiency.

For example, according to one related art, a configuration is disclosed in which the number of stored FOUPs is adjusted by using a FOUP rotation storage shelf configured to be capable of placing a plurality of FOUPs. According to the above related art, it is possible to cope with the increase or decrease in the number of storage containers. In particular, there is disclosed a method for coping with a case where the number of substrates to be processed in one batch is increased. According to another related art, a configuration is disclosed which includes an upper I/O stage corresponding to a ceiling cassette transport AGV, a lower I/O stage corresponding to an AGV moving manually or moving along a floor and a dummy or a monitoring cassette shelf provided between the two upper and lower I/O stages. According to a further related art, a configuration is disclosed in which a storage part for storing FOUPs is provided on the upper side of a processing furnace.

According to the above-mentioned related arts, the width of the apparatus is at least 1,100 mm in accordance with the SEMI (Semiconductor Equipment and Materials International) standards. Therefore, in order to increase the number of stored FOUPs without increasing the footprint, the FOUPs are disposed above the apparatus. However, the height of the apparatus cannot be increased unlimitedly because there is a limitation on the height of the apparatus or the height of the division due to the limitation of the height of the Fab in the case of transporting the apparatus, the road traffic law or the transportation height of an airplane.

Further, in the case of increasing the number of substrates to be processed in a delivery-completed apparatus, it is necessary to add a buffer shelf to the upper part of the apparatus and to replace a robot transport device. This makes it difficult to modify the apparatus. In the above-mentioned related arts, there is no description about such modification and conversion of the apparatus.

SUMMARY

Described herein is a technique capable of coping with a change in the number of product substrates to be processed, which requires apparatus modification.

According to one aspect of the technique described herein, there is provided a substrate processing apparatus including: a transport mechanism including a support where a substrate container is placed and an elevating mechanism configured to raise or lower the support; a storage part including a placement part where the substrate container is placed and a driving part configured to raise or lower the placement part away from or into a movable region of the support; and a controller configured to control the transport mechanism and the storage part such that the substrate container is delivered between the support and the placement part by the driving part raising or lowering the placement part from outside of the movable region of the support into the movable region of the support.

BRIEF DESCRIPTION OF THE DRAWINGS

FIG. 7 schematically illustrates a comparative example of a transfer sequence executed by the sub-controller of the substrate processing apparatus preferably used in the embodiment.

FIG. 8A schematically illustrates an example of a lifting, lowering and transferring sequence executed by the sub-controller of the substrate processing apparatus preferably used in the embodiment.

DETAILED DESCRIPTION

<Configuration of Substrate Processing Apparatus>

Figure 1:
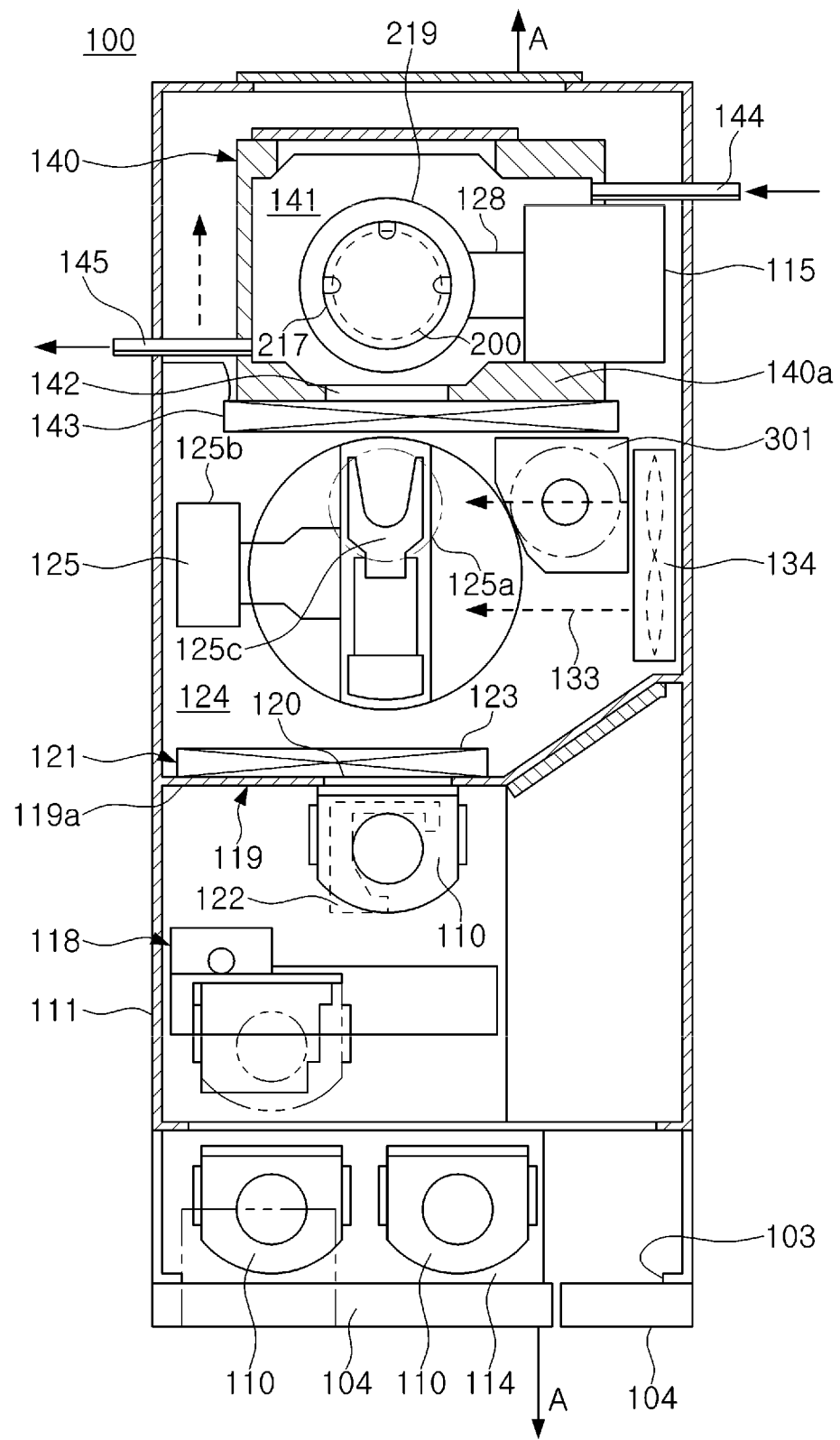
FIG. 1 is a diagram schematically illustrating a plan view of a substrate processing apparatus preferably used in an embodiment described herein.

Hereinafter, an embodiment will be described with reference to the drawings. In the following description, like reference numerals refer to like parts, and the description of the like parts may be omitted. For the convenience of description, features such as width, thickness and shape of each component shown in drawings may be schematically illustrated and may differ from those of actual component. However, the schematic illustrations of the components are examples and do not limit the interpretation of the features.

Hereinafter, a substrate processing apparatus using a heater according to the embodiment will be described with reference to the FIGS. 1 through 3. In the specification, the term "wafer" may refer to "wafer itself" or collectively refer to "stacked structure of wafer and layer or film formed on the surface thereof." The term "surface of wafer" may refer to "surface of wafer itself" or "surface of layer or film formed on the surface of wafer" (i.e. "top surface of the stacked structure").

Therefore, hereinafter, "supplying a predetermined gas to a wafer" refers to "directly supplying a predetermined gas to a surface (exposed surface) of the wafer itself" or "supplying a predetermined gas to a layer or film formed on a wafer" (i.e. "supplying a predetermined gas to the top surface of the stacked structure"). Hereinafter, "forming a predetermined layer (or film) on a wafer" refers to "forming a predetermined layer (or film) directly on the surface (exposed surface) of the wafer itself" or "forming a predetermined layer (or film) on the stacked structure" (i.e. "forming a predetermined layer (or film) on the top surface of the stacked structure"). Hereinafter, the term "substrate" is used in the same sense as "wafer," and the term "wafer" may be replaced by "substrate."

Hereinafter, a substrate processing apparatus according to the embodiment will be described with reference to the drawings. The substrate processing apparatus according to the embodiment may be a semiconductor manufacturing apparatus for performing a substrate processing of a method of manufacturing of an IC (Integrated Circuit) which is a semiconductor device. Hereinafter, a batch type vertical apparatus which is the substrate processing apparatus for performing process such as oxidation process, diffusion process and CVD process will be described. The batch type vertical apparatus may be simply referred to as a "processing apparatus".

Figure 2:
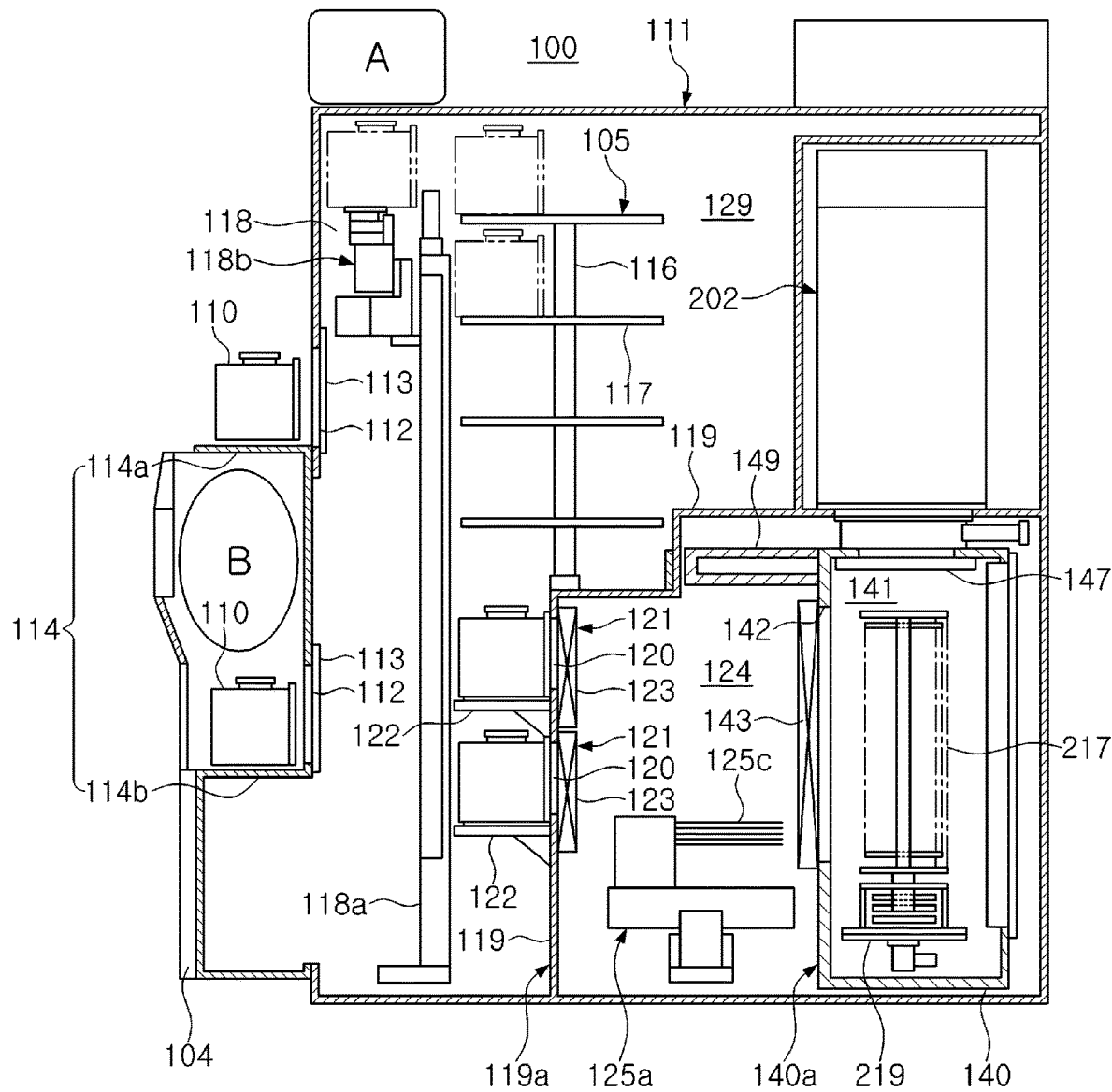
FIG. 2 schematically illustrates a cross-section taken along the line A-A of the substrate processing apparatus shown in FIG. 1.
Figure 3:
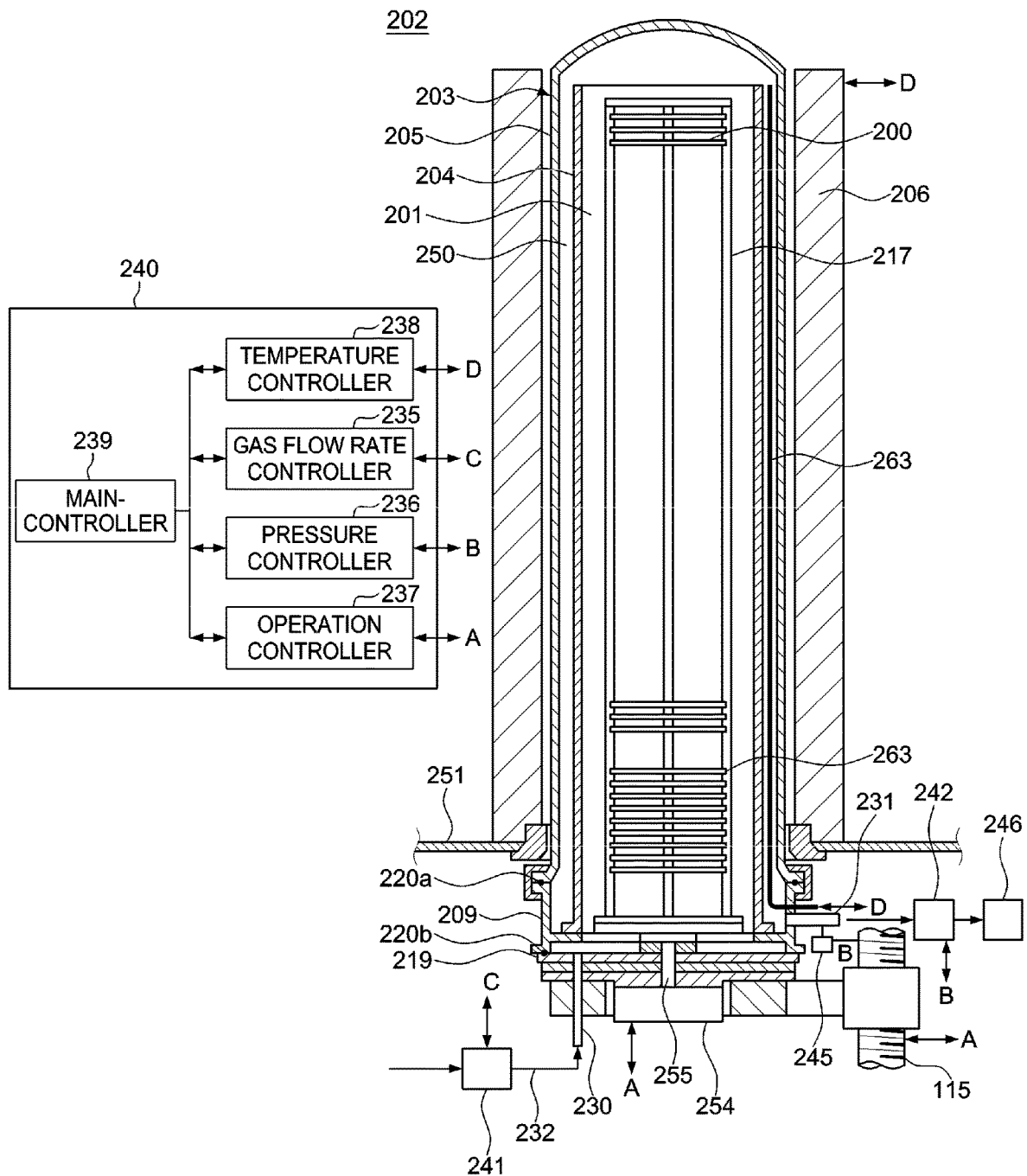
FIG. 3 schematically illustrates a vertical cross-section of a thermal process furnace of the substrate processing apparatus preferably used in the embodiment.

As shown in FIGS. 1 and 2, the substrate processing apparatus 100 includes a housing 111. According to embodiment, a front opening unified pod (FOUP) 110 is used as a wafer carrier (hereinafter, also referred to as "substrate container") for accommodating and transporting wafers 200 such as silicon substrates. Hereinafter, the FOUP 110 is also referred to as a pod 110. A front maintenance port 103 for maintenance of the substrate processing apparatus 100 is provided at the front portion of a front wall 111a of the housing 111. Front maintenance doors 104, which open and close the front maintenance port 103, are provided at the lower front side of the housing 111. A pod loading/unloading port 112 is provided at the front wall 111a of the housing 111 for loading and unloading the FOUP 110 into and from the housing 111. The pod loading/unloading port 112 is also referred to as "substrate container loading/unloading port". A front shutter 113 opens and closes the pod loading/unloading port 112. The front shutter 113 is also referred to as "substrate container loading/unloading port opening/closing mechanism". Loading port shelves 114, specifically, a loading port shelf (upper loading port shelf) 114a and a loading port shelf (lower loading port shelf) 114b are provided at front portion of the pod loading/unloading port 112, respectively. The pod 110 is aligned while placed on the loading port shelf 114a or the loading port shelf 114b. The pod 110 is loaded onto or unloaded from the loading port shelves 114 by an in-step transfer apparatus such as an OHT (Overhead Hoist Transfer) and AGV (Automated Guided Vehicle). The loading port shelves 114 may be configured as one of placement parts according to the embodiment. The loading port shelf 114a serves as an OHT stage (first stage) and the loading port shelf 114b serves as an AGV stage (second stage).

A rotatable pod shelf 105 serving as a rotation storage shelf is provided over the substantially center portion of the housing 111. The rotatable pod shelf 105 is also referred to as a substrate container placement shelf. The rotatable pod shelf 105 may hold plurality of pods 110. The rotatable pod shelf 105 includes a vertical column 116 capable of rotating horizontally and shelf plates 117 provided at the vertically positioned four portions of the vertical column 116. The shelf plates 117 are also referred to as substrate container placement plates. The shelf plates 117 are configured to support a plurality of pods 110 while the plurality of pods 110 are placed thereon. A pod transport device 118 serving as a carrier loader is provided between the loading port shelf 114 and the rotatable pod shelf 105 in the housing 111. The pod transport device 118 is also referred to as a substrate container transport device. The pod transport device 118 includes a pod elevator 118a capable of elevating the pod 110 while the pod 110 is placed on a support, and a pod transport mechanism 118b serving as a transport mechanism. The pod transport mechanism 118b includes an extensible arm capable of moving the support. The pod elevator 118a is also referred to as a substrate container elevating mechanism and the pod transport mechanism 118b is also referred to as a substrate container transport mechanism. The pod transport device 118 transports the pod 110 among the loading port shelves 114, the rotatable pod shelf 105 and a pod opener 121 by consecutive operations of the pod elevator 118a and the pod transport mechanism 118b. The pod opener 121 is also referred to as a substrate container cap opening/closing mechanism. In addition, pod detecting sensors (not shown) are provided at the loading port shelves 114, the rotatable pod shelf 105 and the pod opener 121, respectively. Thus, pod 110 is efficiently transported. In the embodiment, an operation mechanism is provided at the space A and the space B shown in FIG. 2. The operation mechanism includes movable shelves, which is described later. In the embodiment, for example, an extra-shelf 131 serving as the movable shelf and a sub-shelf 132 serving as the movable shelf are provided, respectively. Movable placement parts 131a and 132a and pod detecting sensors (not shown) are provided at the extra-shelf 131 and the sub-shelf 132, respectively.

A sub-housing 119 is provided below the substantially center portion in the front-rear direction in the housing 111 toward the rear end of the substrate processing apparatus 100. A pair of wafer loading/unloading ports 120 is provided at a front wall 119a of the sub-housing 119. The wafers 200 are loaded into or unloaded from the sub-housing 119 through the pair of wafer loading/unloading ports 120. The pair of wafer loading/unloading ports 120 is simply referred to as substrate loading/unloading ports. The pair of wafer loading/unloading ports 120 is vertically arranged in two stages. A pair of pod openers 121 is provided at upper and lower wafer loading/unloading ports 120, respectively. The pair of pod openers 121 includes a support 122 serving as a placement part on which the pod 110 is placed and a cap opener 123 for detaching the cap of the pod 110, respectively. When the cap of the pod 110 placed on the support 122 is detached by the cap opener 123, the wafer entrance of the pod 110 is opened.

The sub-housing 119 defines a transfer chamber 124 fluidically isolated from the transfer region 129 in which the pod transport device 118 or the rotatable pod shelf 105 is provided. A wafer transport mechanism 125 is provided in the front portion of the transfer chamber 124. The wafer transport mechanism 125 is also referred to as a substrate transport mechanism 125. The wafer transport mechanism 125 includes a wafer transport device 125a and a wafer transport device elevator 125b. The wafer transport device 125a and the wafer transport device elevator 125b are also referred to as substrate transport device 125a and a substrate transport device elevating mechanism 125b, respectively. The wafer transport device 125a supports the wafer 200 by tweezers 125c and horizontally rotates or moves the wafer 200 up and down. The wafer transport device elevator 125b ascends and descends the wafer transport device 125a. The wafer transport mechanism 125 may charge or discharge the wafer 200 into or from a boat 217 by consecutive operations of the wafer transport apparatus elevator 125b and the wafer transport device 125a. The boat 217 is also referred to as a substrate retainer 217.

As shown in FIG. 1, a clean air supply mechanism 134 provided at the right end portion of the transfer chamber 124 opposite to the wafer transport device elevator 125b. The clean air supply mechanism 134 is configured to supply clean air 133 such as clean atmosphere and an inert gas. The clean air 133 ejected from the clean air supply mechanism 134 flows around the wafer transport device 125a. Thereafter, the clean air 133 is exhausted from the housing 111 through a duct (not shown) or circulated back to the primary side (supply side) of the clean air supply mechanism 134, and then ejected again into the transfer chamber 124 by the clean air supply mechanism 134.

A housing 140 capable of maintaining a pressure lower than the atmospheric pressure (hereinafter, also referred to as "negative pressure") is provided at the rear portion of the transfer chamber 124. The housing 140 is also referred to as a pressure-resistant housing 140. A load lock chamber 141 serving as a standby chamber of a load lock type having a volume capable of accommodating the boat 217 is defined by the pressure-resistant housing 140. A wafer loading/unloading port 142 is provided at a front wall 140a of the pressure-resistant housing 140. The wafer loading/unloading port 142 is also referred to as a substrate loading/unloading port 142. The wafer loading/unloading port 142 is opened and closed by a gate valve 143. The gate valve 143 is also referred to as a substrate loading/unloading port opening/closing mechanism 143. A gas supply pipe 144 for supplying nitrogen gas to the load lock chamber 141 and an exhaust pipe 145 for exhausting the load lock chamber 141 to negative pressure are connected to a pair of sidewalls of the pressure-resistant housing 140. A processing furnace 202 is provided above the load lock chamber 141. The lower end portion of the processing furnace 202 is configured to be opened and closed by a furnace opening gate valve 147. The furnace opening gate valve 147 is also referred to as a furnace opening opening/closing mechanism 147. A furnace opening gate valve cover 149 is provided at the upper end portion of the front wall 140a of the pressure-resistant housing 140. The furnace opening gate valve cover 149 is capable of housing the furnace opening gate valve 147 when the lower end portion of the processing furnace 202 is opened.

As shown in FIG. 1, a boat elevator 115 for elevating and lowering the boat 217 is provided in the housing 140. The boat elevator 115 is also referred to as a substrate retainer elevating mechanism. An arm 128 serving as a connection part is connected to the boat elevator 115. A seal cap 219 is provided horizontally at the arm 219. The seal cap 219 may support the boat 217 vertically and close the lower end of processing furnace 202. The boat 217 includes a plurality of support parts (not shown). The plurality of support members of the boat 217 is configured to support plurality of wafers 200 (e.g., 50 to 125 wafers) aligned concentrically in horizontal orientation.

Hereinafter, the operation of the substrate processing apparatus 100 will be described. As shown in FIGS. 1 and 2, when the pod 110 is placed on one of the loading port shelves 114, the front shutter 113 is opened and the pod 110 placed on one of the loading port shelves 114 is transported into the housing 111 through the pod loading/unloading port 112 by the pod transport device 118. The pod 110 transported into the housing 111 is automatically transported to and temporarily stored in the designated shelf plate 117 of the rotatable pod shelf 105 by the pod transport device 118, and then transported toward the pod opener 121 from the shelf plate 117 and placed on the support 122. The wafer loading/unloading port 120 of the pod opener 121 is closed by the cap opener 123, and the transfer chamber 124 is filled with clean air 133. For example, since the transfer chamber 124 is filled with the clean air 133 such as nitrogen gas, the oxygen concentration of the transfer chamber 124 is equal to or lower than 20 ppm. Thus, the oxygen concentration of the transfer chamber 124 is lower than the oxygen concentration of the inner atmosphere of the housing 111.

When the wafer entrance of the pod 110 placed on the support 122 is pressed against the wafer loading/unloading port 120 of the front wall 119a of the sub-housing 119, the cap opener 123 detaches the cap of the pod 110 and the wafer entrance of the pod 110 is opened. The inner atmosphere of the load lock chamber 141 is maintained to the atmospheric pressure in advance. When the wafer loading/unloading port 142 of the load lock chamber 141 is opened by the operation of the gate valve 143, the wafer 200 is then transported out of the pod 110 by the tweezers 125c of the wafer transport device 125a via the wafer entrance, aligned by a notch alignment device 301. The wafer 200 is then loaded into the load lock chamber 141 via the wafer loading/unloading port 142 and charged into the boat 217. The wafer transport device 125a then returns to the pod 110 and transports the next wafer 200 from the pod 110 into the boat 217. The structure and operation of the wafer transfer device 125a will be described later in detail.

While the wafer transfer device 125a loads the wafer 200 from one of the upper pod opener 121 and the lower pod opener 121 into the boat 217, another pod 110 is transported by the pod transport device 118 to the other one of the upper pod opener 121 and the lower pod opener 121, and opened.

When a predetermined number of wafers 200 are charged into the boat 217, the wafer loading/unloading port 142 is closed by the gate valve 143, and the load lock chamber 141 is depressurized by being evacuated through the exhaust pipe 145. When the load lock chamber 141 is depressurized to the same pressure as the inner pressure of the processing furnace 202, the lower end portion of the processing furnace 202 is opened by the furnace opening gate valve 147. The furnace opening gate valve 147 is loaded into the furnace entrance gate valve cover 149 and accommodated therein. Next, the seal cap 219 is lifted by the boat elevator 115, and the boat 217 supported by the seal cap 219 is loaded into the processing furnace 202.

After the boat 217 is loaded into the processing furnace 202, the wafers 200 are processed in the processing furnace 202. After the wafers 200 are processed, the boat 217 is unloaded by the boat elevator 115. After the inner pressure of the load lock chamber 141 returns the atmospheric pressure, the gate valve 143 is opened. The wafers 200 and the pod 110 are unloaded from the housing 111 in the order reverse to that described above except for the aligning process of the wafers 200 by the notch alignment device 301.

Hereinafter, the processing furnace 202 according to the embodiment will be described with reference to FIG. 3. As shown in FIG. 3, the processing furnace 202 includes a heater 206 serving as a heating mechanism. The heater 206 is cylindrical, and provided in vertical orientation while being supported by a heater base 251 serving as a support plate.

A process tube 203 serving as a reaction tube is provided in and concentric with the heater 206. The process tube 203 includes an inner reaction tube (inner tube) 204, an outer reaction tube (outer tube) 205 provided outside the inner reaction tube 204. The inner reaction tube 204 is made of a heat-resistant material such as quartz ($SiO_2$) and silicon carbide (SiC). The inner reaction tube 204 is cylindrical with open upper and lower ends. A process chamber 201 is provided in the hollow cylindrical portion of the inner reaction tube 204. The process chamber 201 is capable of accommodating wafers 200 serving as substrates. A boat 217 supporting the wafers 200 vertically arranged in multiple stages while the wafers 200 being in horizontal orientation is accommodated in the process chamber 201. The outer reaction tube 205 is made of a heat-resistant material such as quartz ($SiO_2$) and silicon carbide (SiC). The inner diameter of the outer reaction tube 205 is larger than the outer diameter of the inner reaction tube 204. The outer reaction tube 205 is cylindrical with a closed upper end and an open lower end. The outer reaction tube 205 is provided concentrically with the inner reaction tube 204.

A manifold 209 is provided under and concentric with the outer reaction tube 205. The manifold 209 is made of a metal such as stainless steel (SUS), and cylindrical with open upper and lower ends. The manifold 209 is engaged with the inner reaction tube 204 and the outer reaction tube 205 so as to support the inner reaction tube 204 and the outer reaction tube 205. An O-ring 220a serving as a sealing part is provided between the manifold 209 and the outer reaction tube 205. The process tube 203 is provided in vertical orientation with the manifold 209 thereunder supported by the heater base 251. A reaction vessel is constituted by the process tube 203 and the manifold 209.

A nozzle 230 serving as a gas introduction part is connected to the seal cap 219 which will be described later so as to communicate with the process chamber 201. A gas supply pipe 232 is connected to the nozzle 230. A process gas supply source (not shown) and an inert gas supply source (not shown) are connected to the gas supply pipe 232 via a mass flow controller 241 serving as a gas flow rate controller. The process gas supply source (not shown) and the inert gas supply source (not shown) are provided at the upstream side of the gas supply pipe 232 opposite to the nozzle 230. A gas flow rate controller 235 is electrically connected to the mass flow controller 241. The gas flow rate controller 235 controls the mass flow controller 241 such that the flow rate of the gas supplied into the process chamber 201 becomes a desired flow rate at a desired timing. A gas supply system is constituted by the nozzle 230, the gas supply pipe 232, and the mass flow controller 241. The nozzle 230 may include a first nozzle 230a, a second nozzle 230b (not shown) and a third nozzle 230c (not shown). The gas supply pipe 232 may include a first gas supply pipe 232a (not shown), a second gas supply pipe 232b (not shown) and a third gas supply pipe 232c (not shown). The mass flow controller 241 may include a first mass flow controller 241a (not shown), a second mass flow controller 241b (not shown) and a third mass flow controller 241c (not shown). A process gas supply system may be constituted by the first nozzle 230a (not shown), the first gas supply pipe 232a (not shown) and the first mass flow controller 241a (not shown). A reactive gas supply system may be constituted by the second nozzle 230b (not shown), the second gas supply pipe 232b (not shown) and the second mass flow controller 241b (not shown). An inert gas supply system may be constituted by the third nozzle 230c (not shown), the third gas supply pipe 232c (not shown) and the third mass flow controller 241c (not shown). The inert gas supply system is also referred to as a purge gas supply system.

An exhaust pipe 231 for exhausting the inner atmosphere of the process chamber 201 is provided at the manifold 209. The exhaust pipe 231 is disposed at the lower end of an annular space 250 which is gap between the inner reaction tube 204 and the outer reaction tube 205. The exhaust pipe 231 is spatially connected to the annular space 250. A pressure sensor 245 serving as a pressure detector, an APC (Automatic Pressure control) valve 242 serving as a pressure adjusting mechanism and a vacuum exhaust device 246 such as a vacuum pump are sequentially provided at the exhaust pipe 231 from the upstream side to the downstream side of the exhaust pipe 231. The vacuum exhaust device 246 vacuum-exhausts the process chamber 201 such that the inner pressure of the process chamber 201 is at desired pressure (vacuum level). A pressure controller 236 is electrically connected to the APC valve 242 and the pressure sensor 245. The pressure controller 236 is configured to control the APC valve 242 based on the pressure detected by the pressure sensor 245 such that the inner pressure of the process chamber 201 is a predetermined pressure at a desired timing.

The seal cap 219 capable of airtightly sealing the lower end opening of the manifold 209 is provided under the manifold 209. The seal cap 219 is provided under the manifold 209 so as to be in contact with the lower end of the manifold 209. The seal cap 219 is made of metal such as stainless steel, and is a disk-shaped. An O-ring 220b serving as a sealing part is provided on the upper surface of the seal cap 219 and is in contact with the lower end of the manifold 209. A rotating mechanism 254 to rotate the boat 217 is provided at the seal cap 219 opposite to the process chamber 201. A rotating shaft 255 of the rotating mechanism 254 is connected to the boat 217 through the seal cap 219. As the rotating mechanism 254 rotates the boat 217, the wafers 200 are rotated. The seal cap 219 may be moved up and down by the boat elevator 115 serving as an elevating mechanism vertically provided outside the process tube 203. When the seal cap 219 is moved up and down by the boat elevator 115, the boat 217 may be loaded into the process chamber 201 or unloaded from the process chamber 201. An operation controller 237 is electrically connected to the rotating mechanism 254 and the boat elevator 115. The operation controller 237 is configured to control the rotating mechanism 254 and the boat elevator 115 such that the rotating mechanism 254 and the boat elevator 115 perform the desired operation at a desired timing.

The boat 217 serving as a substrate retainer supports the wafers 200 which are concentrically arranged in the vertical direction and in horizontally orientation. The boat 217 is made of heat-resistant material such as quartz and silicon carbide. An insulating plate 216 serving as an insulating part is provided in multi-stages under the boat 217. The insulating plate 216 is made of heat-resistant material such as quartz and silicon carbide, and is disk-shaped. The insulating plate 218 suppresses the transmission of heat from the heater 206 to the manifold 209.

A temperature sensor 263 serving as a temperature detector is provided in the process tube 203. A temperature controller 238 is electrically connected to the heater 206 and the temperature sensor 263. The temperature controller 238 is configured to adjust the energization state of the heater 206 based on the temperature detected by the temperature sensor 263 such that the inner temperature of the process chamber 201 reaches and is maintained at a desired temperature at a desired timing.

Sub-controllers such as the gas flow rate controller 235, the pressure controller 236, the operation controller 237 and the temperature controller 238 as well as an operation device (not shown) and an input/output device (not shown) are electrically connected to a main-controller 239 that controls the entire substrate processing apparatus 100. A controller 240 is constituted by the gas flow rate controller 235, the pressure controller 236, the operation controller 237, the temperature controller 238 and the main-controller 239.

<Controller>

Figure 4:
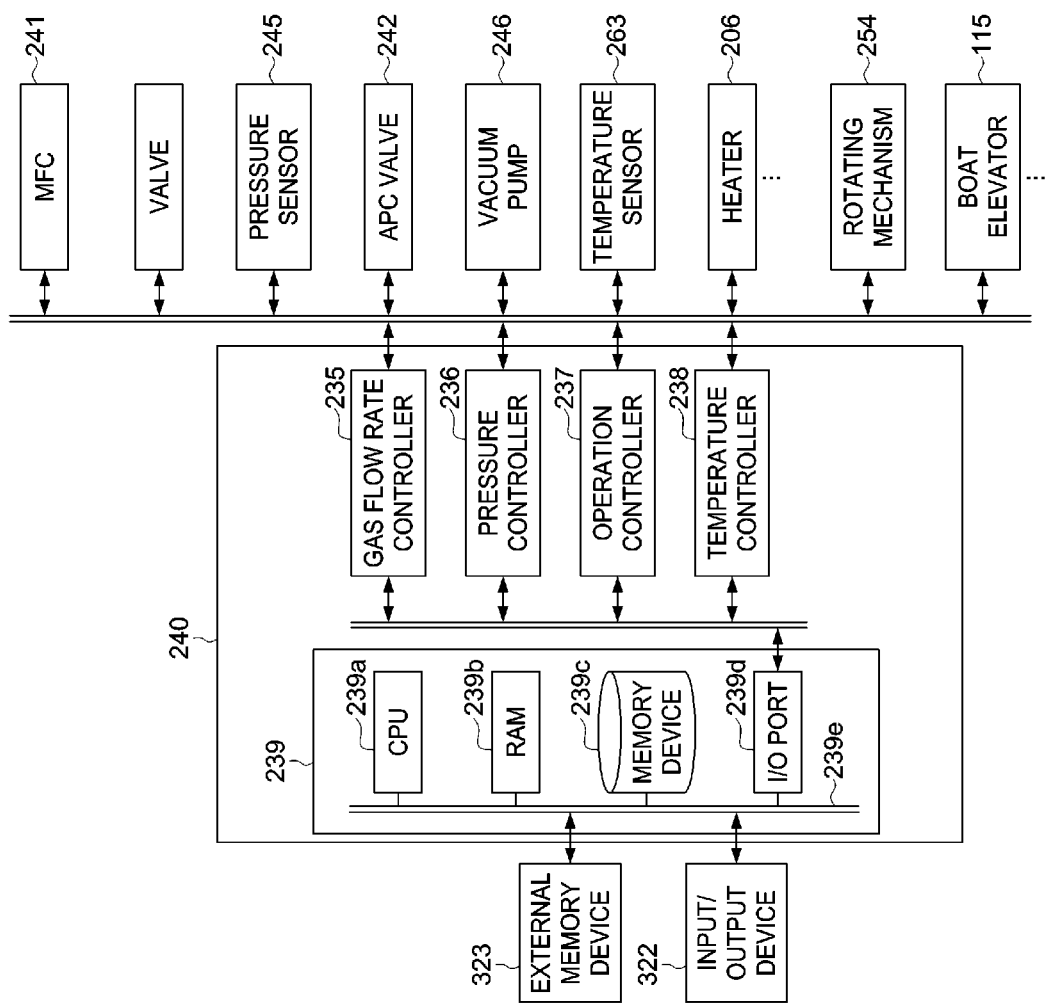
FIG. 4 is a block diagram schematically illustrating a configuration of a controller and components controlled by the controller of the substrate processing apparatus preferably used in the embodiment.

The controller 240 serving as a control device will be described with reference to FIGS. 4 and 5.

The controller 240 including the main-controller 239 is connected to components such as the heater 206, the mass flow controller 241, valves provided at the gas supply pipe 232, the APC valve 242, the vacuum pump 246, the rotating mechanism 254 and the boat elevator 115. The controller 240 controls the operations of the gas flow rate controller 235, the pressure controller 236, the operation controller 237, the temperature controller 238 to perform various operations such as a temperature adjusting operation of the heater 206, a flow rate adjusting operation of the mass flow controller 241, opening/closing operation of the valves provided at the gas supply pipe 232, an opening/closing operation of the APC valve 242, a start and stop operation of the vacuum pump 246, a rotation speed adjusting operation of the boat 217 by the rotating mechanism 254, and an elevating operation of the boat 217 by the boat elevator 115.

The main-controller 239 is embodied by a computer including a CPU (Central Processing Unit) 239*a*, a RAM (Random Access Memory) 239*b*, a memory device 239*c* and an I/O port 239*d*. The RAM 239*b*, the memory device 239*c* and the I/O port 239*d* may exchange data with the CPU 239*a* through an internal bus 239*e*. For example, an input/output device 322 such as a touch panel is connected to the main-controller 239.

The memory device 239*c* is embodied by components such as a flash memory and HDD (Hard Disk Drive). A control program for controlling the operation of the substrate processing apparatus 100, a transfer sequence containing information on the transfer sequence between a pod transport device 118 and the movable shelves 131, 132, which are described later, or a process recipe containing information on the sequence and conditions of a substrate processing described later is readably stored in the memory device 121*c*. The transfer sequence and the process recipe are obtained by combining steps of the substrate processing described later such that the controller 121 may execute the steps to acquire a predetermine result, and function as a program. Hereafter, the process recipe and the control program are collectively referred to as a program. The process recipe is simply referred to as a recipe. In this specification, "program" may indicate only the recipe, indicate only the control program, or indicate both of them. The RAM 239*b* is a work area where a program or data read by the CPU 239*a* is temporarily stored.

The I/O port 239*d* is connected to transfer mechanisms such as the pod transport device 118, the wafer transport mechanism 125 and the boat elevator 115 via the operation controller 237.

The CPU 239*a* is configured to read a control program from the memory device 239*c* and execute the read control program. Furthermore, the CPU 239*a* is configured to read a process recipe from the memory device 239*c* according to an operation command inputted from the input/output device 322. According to the contents of the read process recipe, the CPU 239*a* may be configured to control various operations such as a transport operation of the pod transport device 118, operations of the placement parts 117, 131*a* and 132*a*, a transport operation of the wafer transport mechanism 125 and an elevating operation of the boat 217 by the boat elevator 115.

The controller 240 is not limited to a dedicated computer. The controller 240 may be embodied by a general-purpose computer. The controller 240 according to the embodiment may be embodied by preparing the external memory device 323 (e.g., a magnetic tape, a magnetic disk such as a flexible disk and a hard disk, an optical disk such as a CD and a DVD, a magneto-optical disk such as MO, a semiconductor memory such as a USB memory and a memory card), and installing the program onto the general-purpose computer using the external memory device 323. The method of providing the program to the computer is not limited to the external memory device 323. The program may be directly provided to the computer by a communication means such as a network (Internet and a dedicated line) instead of the external memory device 323. The memory device 239*c* and the external memory device 323 may be embodied by a computer-readable recording medium. Hereafter, the memory device 239*c* and the external memory device 323 are collectively referred to as recording media. Herein, "recording media" may refer to only the memory device 239*c*, only the external memory device 323, or both.

Figure 5:
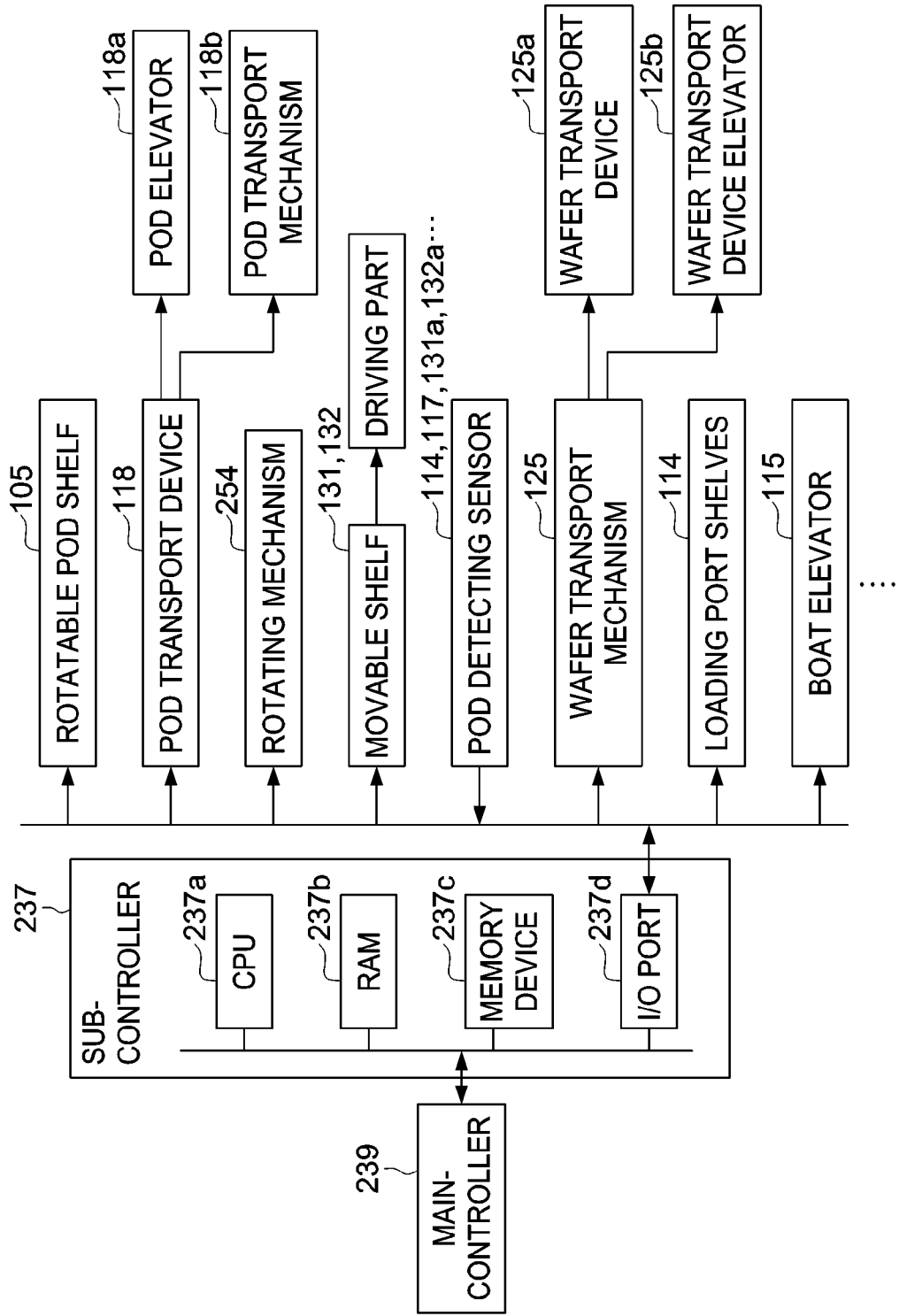
FIG. 5 is a block diagram schematically illustrating a configuration of a sub-controller and components controlled by the sub-controller of the substrate processing apparatus preferably used in the embodiment.

FIG. 5 is an exemplary block diagram schematically illustrating a configuration of the operation controller 237, which is one of the sub-controllers, and components controlled by the operation controller 237. As shown in FIG. 5, the operation controller 237 is configured to control each of the transport mechanisms such as the pod transport device 118, the boat elevator 115, the wafer transport mechanism 125, the rotatable pod shelf 105 and the movable shelf 131 described later. The operation controller 237 is configured to receive data from sensors provided at each of the transport mechanisms, respectively. The configuration of the operation controller 237, which is one of the sub-controllers, is similar to that of the controller 240. Therefore, the detailed descriptions of the operation controller 237 are omitted.

When the pod 110 transported from the outside of the apparatus is placed on the loading port shelves 114, a pod detecting sensor (not shown) transmits a signal to the operation controller 237. The operation controller 237 operates the pod transport device 118 to transport the pod 110 to any one of the rotatable pod shelf 105 serving as the operation mechanism and the movables shelves 131 and 132 to be described later, depending on the type of the wafers 200 accommodated in the pod 110.

The operation controller 237 is configured to execute a transfer sequence for performing the delivery of the pod 110 between the rotatable pod shelf 105 and the pod transport device 118. By executing the transfer sequence, the rotatable pod shelf 105 is configured to rotate the placement part 117 using the operation controller 237 and to perform the delivery of the pod 110 to and from the pod transport device 118.

As shown in FIG. 7, in the step S100, the operation controller 237 moves the pod transport device 118 to a FOUP delivery standby position of the FOUP and rotates the placement part 117 of the rotatable pod shelf 105 to move the placement part 117 to a FOUP delivery position.

In the step S200, the operation controller 237 moves the arm of the pod transport device 118 to move the support for supporting the FOUP 110 down below the FOUP delivery position. Then, in the step S300, the operation controller 237 raises the pod transport device 118 to deliver the FOUP 110 from the placement part 117 of the rotatable pod shelf 105 to the support of the pod transport device 118.

In the step S400, the operation controller 237 moves the arm of the pod transport device 118 to its original position. The operation controller 237 rotates the rotatable pod shelf 105 to move the next FOUP 110 to the FOUP delivery position while moving the pod transport device 118 to the FOUP delivery position. The operation controller 237 is configured to repeatedly execute the sequence from the step S100 to the step S400 until a predetermined number of the wafers 200 in the FOUP 110 of the rotatable pod shelf 105 are transported.

The operation controller 237 is configured to execute a transfer sequence for performing the delivery of the pod 110 between the movable shelves 131 and 132 serving as operation mechanisms and the pod transport device 118.

Figure 9:
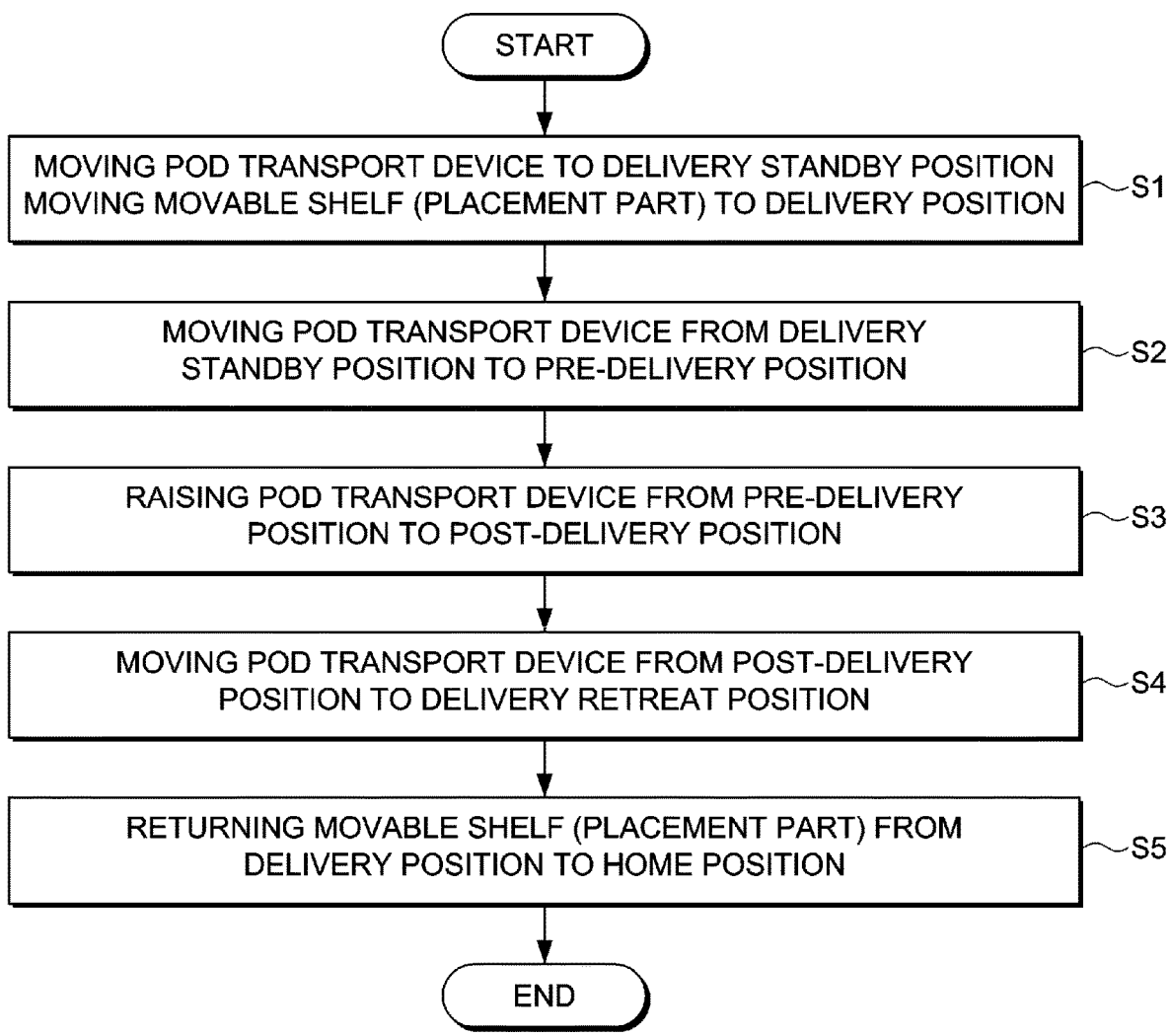
FIG. 9 is a flowchart illustrating a transfer sequence preferably used in the embodiment.

FIG. 9 is a diagram showing a transfer sequence executed by the operation controller 237 in the embodiment. The transfer sequence is a sequence in which the pod 110 is transferred between the pod transport device 118 and the movable shelves 131 and 132 (i.e., the placement parts 131a and 132a). The transfer sequence shown in FIG. 9 is a sequence in which the pod 110 is delivered from the movable shelves 131 and 132 to the pod transport device 118.

The difference between the transfer sequence shown in FIG. 9 and the conventional transfer sequence, for example, the difference between the transfer sequence for the pod transport device 118 shown in FIG. 7 and the transfer sequence for the rotatable pod shelf is that the placement parts 131a and 132a of the movable shelves 131 and 132 are moved to the delivery position of the pod 110 without moving the arm of the pod transport device 118.

The transfer sequence shown in FIG. 9 includes a step S1 of moving the pod transport device 118 to the delivery standby position and moving the movable shelves 131 and 132 (the placement parts 131a and 132a) to the delivery position, a step S2 of moving the pod transport device 118 from the delivery standby position to the pre-delivery position (the position below the placement parts 131a and 132a), a step S3 of raising the pod transport device 118 from the pre-delivery position to the post-delivery position (the position above the placement parts 131a and 132a), a step S4 of moving the pod transport device 118 from the post-delivery position to the delivery retreat position and a step S5 of returning the movable shelves 131 and 132 (the placement parts 131a and 132a) from the delivery position to the home position.

The sequence in which the pod 110 is delivered from the pod transport device 118 to the movable shelves 131 and 132 is the reverse of the transfer sequence shown in FIG. 9. That is, if only the operation of the pod transport device 118 is described, the pod transport device 118 is moved to the delivery retreat position (in S1), the post-delivery position (in S2), the pre-delivery position (in S3) and the delivery standby position (in S4).

On the other hand, the operation of the movable shelves 131 and 132 (the placement parts 131a and 132a) is the same as the transfer sequence shown in FIG. 9 when the pod 110 is delivered from the pod transport device 118 to the movable shelves 131 and 132.

As described above, the operation controller 237 executes control so as to transport the pods 110 placed on the rotatable pod shelf 105 and the movable shelves 131 and 132 or the pods 110 placed on the loading port shelves 114 to the pod opener 121 and transfer the pods 110 to the placement part 122. The operation controller 237 is configured to control the wafer transport mechanism 125 and the boat elevator 115 so as to load the wafers 200 to the boat 217 and so as to load the boat 217 into the processing furnace 202. After a predetermined process is performed on the wafers 200, the operation controller 237 is configured to perform a transport operation opposite to the above-described transport operation so that the processed wafers 200 are stored in the pods 110.

(2) Substrate Processing

Next, a substrate processing using the substrate processing apparatus 100 serving as semiconductor manufacturing apparatus will be described. The substrate processing is one of the semiconductor manufacturing processes. Also, in the description below, the controller 240 controls the operations of the components included in the substrate processing apparatus 100.

In the embodiment, the substrate processing will be exemplified by an example wherein a film is formed on the wafers 200 by alternately supplying the first process gas (source gas) and the second process gas (reactive gas). For example, silicon nitride (SiN) film is formed on the wafers 200 using hexachlorodisilane ($Si_2Cl_6$, abbreviated as HCDS) gas as the source gas and $NH_3$ (ammonia) as the reactive gas. A predetermined film may be formed on the wafers 200 in advance and predetermined pattern may be formed on the wafers 200 or on the predetermined film in advance.

Figure 6:
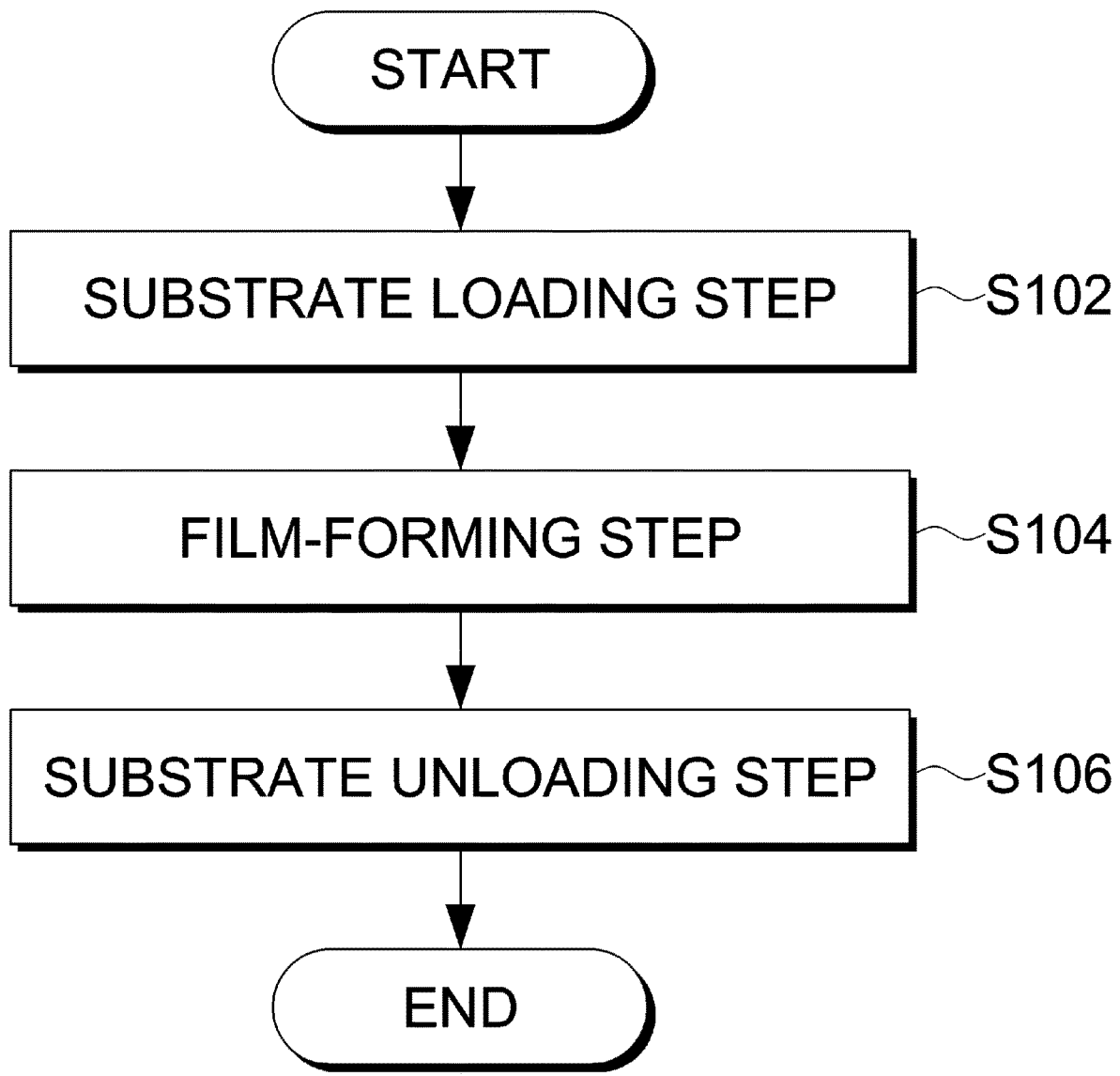
FIG. 6 is a flowchart illustrating a substrate processing preferably used in the embodiment.

Hereinafter, an exemplary sequence of the substrate processing will be described with reference to FIG. 6.

<Substrate Loading Step S102>

In a substrate loading step S102, the boat 217 is charged with the wafers 200, and the boat 217 charged with the wafers 200 is then loaded into the process chamber 201.

<Film-Forming Step S104>

Next, a film-forming step S104 for forming the film on the surfaces of the wafers 200 is performed. In the film-forming step S104, four steps described below, namely, first step, second step, third step and fourth step, are sequentially performed. While performing the first through the fourth steps, the wafers 200 are heated to predetermined temperature by the heater 206.

<First Step>

In the first step, the $Si_2Cl_6$ gas is supplied into the process chamber 201 by opening a valve (not shown) provided at the first gas supply pipe 232a (not shown) and the APC valve 242 provided at the exhaust pipe 231. The first gas supply pipe 232a is also referred to as a $Si_2Cl_6$ gas supply pipe 232a. Specifically, the $Si_2Cl_6$ gas having the flow rate thereof adjusted by the first mass flow rate controller 241a (not shown) is supplied into the process chamber 201 through the first nozzle 230a (not shown) and exhausted through the exhaust pipe 231. At this time, the inner pressure of the process chamber 201 is adjusted to a predetermined pressure. A silicon film is formed on the surfaces of the wafers 200 in the first step.

<Second Step>

In the second step, the valve (not shown) provided at the $Si_2Cl_6$ gas supply pipe (first gas supply pipe) 232a is closed to stop the supply of the $Si_2Cl_6$ gas and the APC valve 242 provided at the exhaust pipe 231 is opened. The vacuum pump 246 exhaust the process chamber 201 to remove the gas remaining in the process chamber 201 from the process chamber 201.

<Third Step>

In the third step, the $NH_3$ gas is supplied into the process chamber 201 by opening a valve (not shown) provided at the second gas supply pipe 232b (not shown) and the APC valve 242 provided at the exhaust pipe 231. The second gas supply pipe 232b is also referred to as an $NH_3$ gas supply pipe 232b. Specifically, the $NH_3$ gas having the flow rate thereof adjusted by the second mass flow controller 241b (not shown) is supplied into the process chamber 201 through the second nozzle 230b (not shown) and exhausted through the exhaust pipe 231. At this time, the inner pressure of the process chamber 201 is adjusted to a predetermined pressure. By chemical reaction between the silicon film on the surfaces of the wafers 200 formed by the $Si_2Cl_6$ gas supplied in the first step and the $NH_3$ gas supplied in the third step, a silicon nitride (SiN) film is formed on the surfaces of the wafers 200.

<Fourth Step>

In the fourth step, the process chamber 201 is purged by an inert gas. The valve (not shown) provided at the $NH_3$ gas supply pipe (second gas supply pipe) 232b is closed to stop the supply of the $NH_3$ gas. The APC valve 242 provided at the exhaust pipe 231 is opened. The vacuum pump 246 exhaust the process chamber 201 to remove the gas remaining in the process chamber 201 from the process chamber 201.

A silicon nitride (SiN) film having desired thickness is formed on the wafers 200 by performing a cycle including the first step through the fourth step multiple times.

<Substrate Unloading Step S106>

Next, the boat 217 accommodating the wafers 200 having the SiN film formed thereon is unloaded from the process chamber 201.

EXAMPLES

An operation for modifying the substrate processing apparatus 100 preferably used in the embodiment will be described with reference to examples.

In the present substrate processing apparatus 100 shown in FIG. 2, four FOUPs may be arranged in one stage of the rotatable pod shelf 105, and the rotatable pod shelf 105 has four stages in total. Therefore, the number of FOUPs that may be arranged in the rotatable pod shelf 105 is 4 FOUP×4, i.e., 16 in total.

Since the lower loading port shelf 114b serving as an AGV stage and the upper loading port shelf 114a serving as an OHT stage are in conformity with the SEMI standards, there is a restriction on the arrangement height and the safe working area. When the pod transport device 118 performs the delivery operation of the pods 110 on the AGV stage 114b and the OHT stage 114a, only one stage of buffer shelf may be provided in the space B shown in FIG. 2, i.e., between the AGV stage 114b and the OHT stage 114a.

Accordingly, two sub-selves (1 FOUP×2=2 FOUPs) may be provided between the upper loading port shelf 114a serving as the OHT stage and the lower loading port shelf 114b serving as the AGV stage 114b (i.e., in the space B). Therefore, a total of 18 FOUPs may be accommodated in the substrate processing apparatus 100. This configuration can be used for a case where the number of product substrates is 125.

In order to process 150 wafers (maximum of 125 wafers can be processed by the above configuration), the configuration of the delivery-completed substrate processing apparatus 100 should be changed. To this end, the number of necessary FOUPs (accommodating 25 wafers) for 2 batches is 22 in total, including: 6 FOUPs×2 batches used for production, 6 FOUPs for filling dummies (for replenishment of missing production wafers), 1 FOUP×2 batches for side dummies (for heat insulation on the upper and lower sides of production wafers) and 1 FOUP×2 batches for monitoring (for inspection of production wafers). In short, four more FOUPs should be added.

When the number of stages of the rotary pod shelf 105 is changed from four stages to five stages, the necessary number of accommodated pods 110 can be obtained as FOUPs are increased. However, in this case, the vertical transport stroke (i.e., the vertical movement length for transport) of the pod transport device 118 needs also to be increased.

When the stroke (movement length) of the pod elevator 118a is increased by employing the five-stage configuration of the rotary pod shelf, the pod transport device 118 needs to be conveyed in a laid-down state after the pod transport device 118 is removed from the housing 111, and needs to be reassembled and adjusted on the spot. As described above, if another buffer shelf is added to increase the number of stages of the delivery-completed substrate processing apparatus 100 to five stages, the pod transport device 118 needs also to be replaced. This requires a large-scale modification. On the other hand, if the number of the pods 110 in one stage provided on the rotary pod shelf 105 is increased to five, the height of the rotary pod shelf 105 remains unchanged. In this case, it is possible to alleviate the burden of having to reassemble and readjust the pod transport device 118 on the spot. However, if the number of pods 110 in one stage provided on the rotary pod shelf 105 is increased from four to five, the frame width of the main body of the substrate processing apparatus 100 should become larger than the conventional one. Therefore, it is difficult to modify the substrate processing apparatus 100 on the spot.

Accordingly, the burden of a design work due to the above-described modification and the burden due to the reassembly and readjustment at a customer's factory (on the spot) have been an important problem in the change of specifications accompanying a modification.

In order to solve the above-described problem, the inventors of the present application have confirmed that by improving the transfer sequence, the movable shelves can be converted into a unit, thereby reducing the burden due to a modification.

First, the conventional transfer sequence was improved to the transfer sequence shown in FIG. 9 according to the present example. That is, the transfer sequence shown in FIG. 9 was applied to the transport of the pod 110 between the movable shelves 131 and 132 and the pod transport device 118. The movable shelves 131 and 132 were modified so that the delivery of the pod 110 to and from the pod transport device 118 can be performed by moving the placement parts 131a and 132a by the driving part. For example, the movable shelf 131 serving as an extra-shelf is configured such that the placement part 131a is driven in the vertical direction by the operation controller 237, and the movable shelf 132 serving as a sub-shelf is configured such that the placement part 132a is driven in the horizontal direction by the operation controller 237.

Figure 8B:
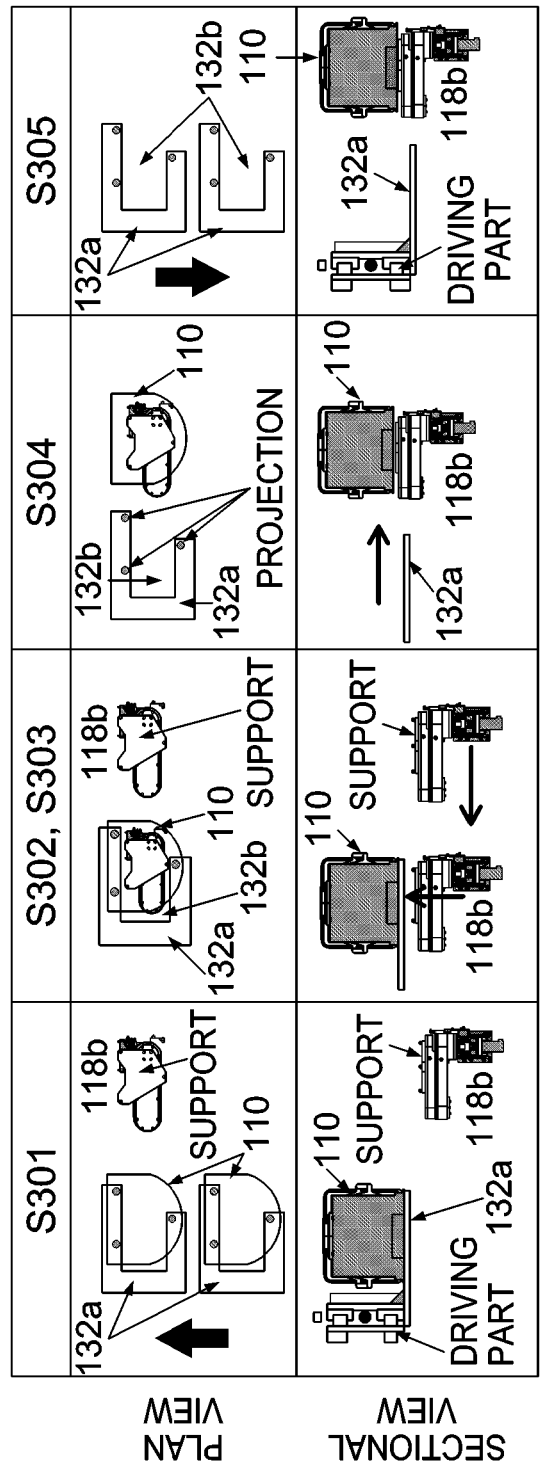
FIG. 8B schematically illustrates an example of a horizontal sliding and transferring sequence executed by the sub-controller of the substrate processing apparatus preferably used in the embodiment.

A case where the improved transfer sequence is applied to the delivery of the pod 110 between each of the movable shelves 131 and 132 and the pod transport device 118 will be described with reference to FIGS. 8A, 8B and 8C. FIG. 8A is a diagram illustrating a transport operation in which the pod 110 placed on the placement part 131a of the movable shelf 131 serving as an extra shelf is placed on the support of the pod transport device 118. The steps S201 to S205 shown in FIG. 8A correspond to the steps S1 to S5 shown in FIG. 9, respectively.

As illustrated in FIG. 8A, in the step S201, the operation controller 237 moves the pod transport device 118 to the delivery standby position and controls the driving part to lower the placement part 131a of the movable shelf 131 and move the placement part 131a to the delivery position.

In the step S202, the operation controller 237 moves the pod transport device 118 from the delivery standby position to the position (pre-delivery position) below the placement part 131a of the movable shelf 131 in a state in which the arm of the pod transport device 118 is not extended or contracted and the support of the pod transport device 118 is held at the initial position. In the step S203, the operation controller 237 raises the pod transport device 118 from the pre-delivery position and moves the pod transport device 118 to the post-delivery position so that the pod 110 can be placed on the support of the pod transport device 118 from the placement part 131a, in a state in which the support of the pod transport device 118 is still kept at the initial position.

In the step S204, the operation controller 237 moves the pod transport device 118 from the post-delivery position to the delivery retreat position. Finally, in the step S205, the operation controller 237 operates the driving part to return the placement part 131a to the home position from the delivery position. With this operation, the delivery of pod is performed between the movable shelf 131 and the pod transport device 118. Thereafter, the pod transport device 118 is moved to the destination position of the pod 110.

At this time, the support of the pod transport device 118 is constantly fixed without moving from the initial position (without extending or contracting the arm). That is, by lowering the placement part 131a, the placement part 131a is moved into the range of the movable region of the pod transport device 118. Therefore, the delivery of the pod 110 may be performed without having to move the support of the pod transport device 118.

As described above, when the delivery of the pod 110 to and from the pod transport device 118 is performed by adding the movable shelf 131 serving as the operation mechanism, there is no need to consider the operation of the arm of the pod transport device 118 and to change the movable region of the pod transport device 118. Therefore, it is possible to shorten the time required for raising the pod transport device 118.

FIG. 8B is a diagram illustrating a transport operation in which the pod 110 placed on the placement part 132a of the movable shelf 132 serving as a sub-shelf is placed on the support of the pod transport device 118. The steps S301 to S305 shown in FIG. 8B correspond to the steps S1 to S5 shown in FIG. 9, respectively.

The upper view in FIG. 8B is a top plan view of the transport process showing delivery of the pod 110 between the pod transport device 118 and the movable shelf 132. The lower view in FIG. 8B is a side sectional view of the transport process showing delivery of the pod 110 between the pod transport device 118 and the movable shelf 132. In the plan view of FIG. 8B, the pod 110 is shown transparent so as to clarify the positional relationship between the pod transport mechanism 118b and the placement part 132a.

In the step S301, the operation controller 237 moves the pod transport device 118 to the FOUP delivery standby position and slides the placement part 132a of the movable shelf 132 to move the placement part 132a from the home position to the delivery position.

In the step S302, the operation controller 237 moves the pod transport device 118 without moving the arm of the pod transport device 118, thereby moving the support of the pod transport device 118 to the position (the pre-delivery position) immediately below the placement part 132a of the movable shelf 132. In the step S303, the operation controller 237 raises the pod transport device 118 so that the pod 110 is placed on the support of the pod transport device 118 from the placement part 132a, and moves the pod transport device 118 to the post-delivery position. At this time, due to the provision of a notch portion 132b, the support of the pod transport device 118 does not make contact with the placement part 132a, and the pod 110 is placed on the support of the pod transport device 118.

In the step S304, the operation controller 237 moves the pod transport device 118, on which the pod 110 is placed, from the post-delivery position to the delivery retreat position. Finally, in the step S205, the operation controller 237 operates the driving part to return the placement part 132a to the home position from the delivery position. Thus, the delivery of the pod is performed between the movable shelf 132 and the pod transport device 118, and then the pod transport device 118 is moved to the destination position of the pod 110.

At this time, the support of the pod transport device 118 is constantly fixed without moving from the initial position (without extending or contracting the arm). Therefore, it is not necessary to provide an area for the operation of the arm of the pod transport device 118 between the first stage 114a and the second stage 114b.

Figure 8C:
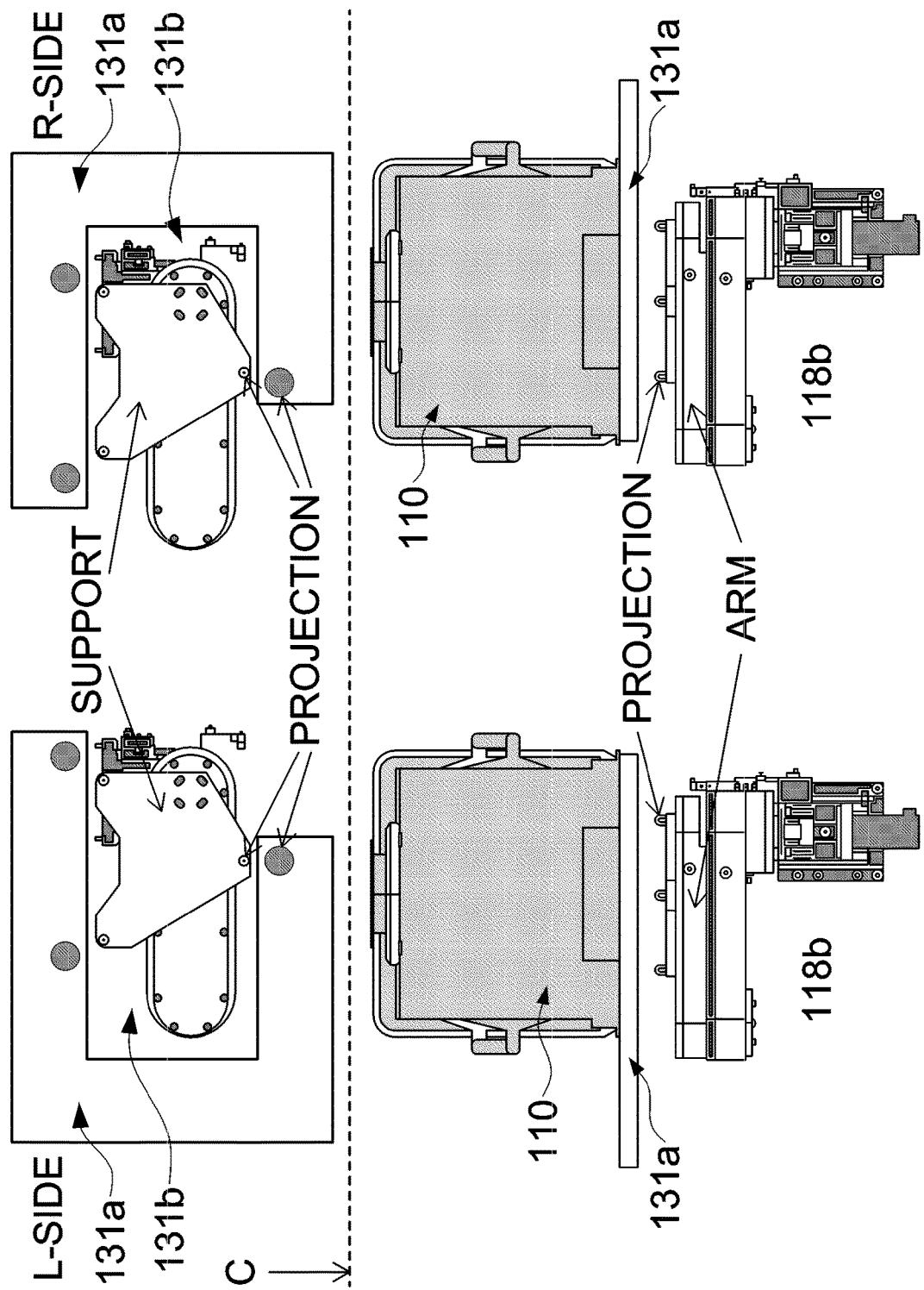
FIG. 8C schematically illustrates an example of delivery of a pod common to FIGS. 8A and 8B.

FIG. 8C is a top plan view (hereinafter abbreviated as "view C") showing a state in which in the step S202 in FIG. 8A (the step S302 in FIG. 8B), the pod transport device 118 is moved to the position (pre-delivery position) below the movable shelves 131 and 132 by the operation controller 237 without moving the arm of the pod transport device 118. In view C, the pod 110 is omitted in order to clarify the positional relationship between the placement parts 131a and 132a and the pod transport mechanism 118b.

As shown in FIGS. 8A to 8C, in the next step (S203 or S303), the pod transport mechanism 118b, in which the arm is in the initial position, is configured not to interfere with the placement parts 131a and 132a of the movable shelves 131 and 132. That is, the notch portions (spaces) 131b and 132b of the placement parts 131a and 132a are larger than the pod transport mechanism 118b as well as the support of pod transport device 118. In view C, the first projections of the placement parts 131a and 132a and the second projections provided in the support of the pod transport mechanism 118b are provided at substantially the same positions. By making the portions supporting the pod 110 alike, it is possible to make sure that the delivery of the pod 110 is more reliably performed between the movable shelf 131 and the pod transport device 118.

As shown in FIG. 8C, the placement parts 131a and 132a of the R-side movable shelves 131 and 132 as well as the placement parts 131a and 132a of the L-side movable shelves 131 and 132 are configured to make sure that when the operation controller 237 moves the pod transport device 118 to the position below the movable shelves 131 and 132 without moving the arm of the pod transport device 118 in the step S202 (S302), the pod transport mechanism 118b having the arm kept in an initial position state does not interfere with the placement parts 131a and 132a of the movable shelves 131 and 132 in the next step S203 or S303. Accordingly, the delivery standby position, the pre-delivery position, the post-delivery position and the delivery retreat position are symmetrical to each other in the left-right direction. The same transport as that shown in FIGS. 8A and 8B can be performed for the R-side movable shelves. That is, the delivery of the pod 110 can be performed without changing the orientation of the pod transport mechanism 118b on the L side and the R side. Therefore, even when the movable shelves 131 and 132 are added, the transfer sequence can be made common. This makes it possible to suppress the setup operation of the pod transport device 118.

<Space A in FIG. 2>

In the embodiment, as described above, a modification was performed in which the transfer sequence shown in FIG. 9 is applied to the delivery sequence of the pod 110 between the movable shelf 131 (extra-shelf) and the pod transport device 118.

Specifically, the movable shelf 131 serving as an extra-shelf was provided in the upper portion (i.e., the space A) of the area where the pod transport device 118 transports the pod 110. The delivery operation of the pod 110 between the movable shelf 131 and the pod transport device 118 was improved into a lifting, lowering and transferring sequence shown in FIG. 8A, in which the placement part 131a of the extra-shelf 131 can be lifted or lowered toward or away from the pod transport device 118.

Thus, it is not necessary for the arm of the pod transport mechanism 118b to move toward the extra-shelf 131. As shown in FIG. 8C, by making the notch portion 131b of the placement part 131a larger than the pod transport mechanism 118b, it becomes possible to deliver the pod 110 between placement part 131a of the extra-shelf 131 and the support of the pod transport device 118 without moving the arm kept in the initial position state.

Since the placement part 131a of the movable shelf 131 is configured to be moved within the operation range of the conventional pod transport device 118, it is possible to cope with a change of increasing the number of pods 110 to be stored by a small-scale modification in which the extra-shelves 131 are added to the delivery-completed substrate processing apparatus 100. In other words, since two extra-shelves 131 can be disposed on the L-side and the R-side, it is possible to add two buffer shelves while using the substrate processing apparatus 100 shown in FIG. 2 as it is.

<Space B in FIG. 2>

Next, in the embodiment, as described above, a modification was performed in which the transfer sequence shown in FIG. 9 is applied to the delivery sequence of the pod 110 between the movable shelf 132 (the sub-shelf) and the pod transport device 118.

Specifically, the movable shelf 132 serving as a sub-shelf was provided between the OHT stage 114a as a first stage and the AGV stage 114b as a second stage, i.e., in the space B, and the transfer sequence was improved to a horizontal slide transfer sequence shown in FIG. 8B in which the sub-shelf 132 can be slid toward the pod transport device 118. Thus, the arm of the pod transport mechanism 118b does not need to move toward the sub-shelf 132.

By the above modification, it is no longer necessary for the arm of the pod transport mechanism 118b to enter the work area of the second stage 114b defined by the SEMI standards. Since there is no need to consider an arm entry space, it is possible to install the sub-shelves 132 in a vertically filled state. As a result, the movable shelves 132 may be provided in two stages between the first stage 114a and the second stage 114b.

Therefore, according to the configuration shown in FIG. 2, only two buffer shelves are provided between the first stage 114a and the second stage 114b. However, by applying the transfer sequence of the embodiment to the transport of the pod 110 between the pod transport device 118 and the sub-shelves 132, it is possible to provide the sub-shelves 132 in two stages. Since two sub-shelves 132 are arranged on the L-side and the R-side, four buffer shelves can be installed as a result.

Figure 10:
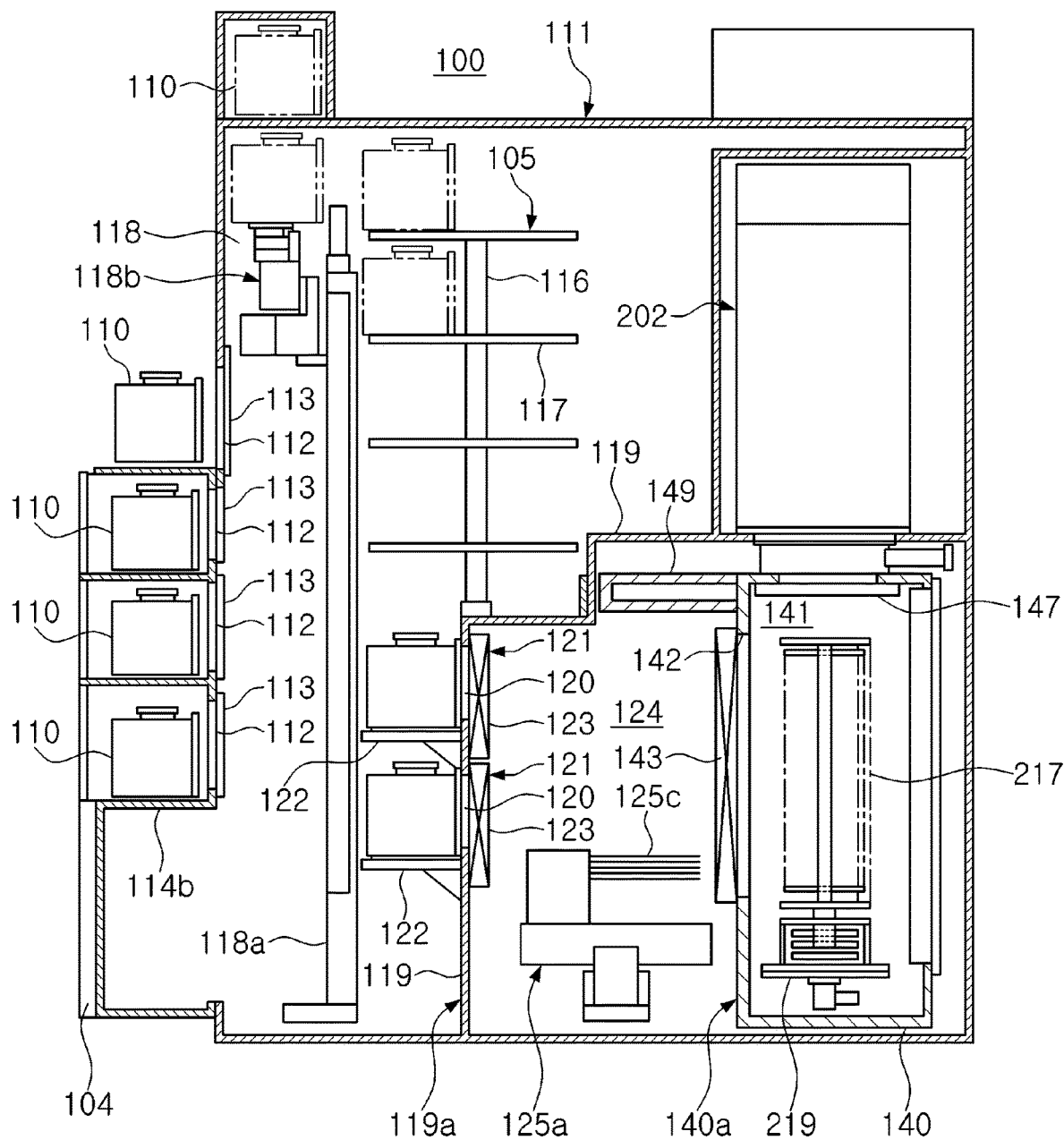
FIG. 10 schematically illustrates a vertical cross-section of the substrate processing apparatus modified according to the embodiment.

FIG. 10 is a view schematically illustrating the substrate processing apparatus 100 modified from the 125-wafer specifications to the 150-wafer specifications according to the embodiment. According to the modified substrate processing apparatus 100 shown in FIG. 10, as compared with the above-described non-modified substrate processing apparatus 100 shown in FIG. 2, two extra-shelves 131 and four sub-shelves 132 were added.

The extra-shelves 131 and the sub-shelves 132 are respectively formed into a unit. Other configurations are the same as those of the non-modified substrate processing apparatus 100 shown in FIG. 2. Therefore, the modified substrate processing apparatus 100 shown in FIG. 10 has the same footprint as that of the non-modified substrate processing apparatus 100 shown in FIG. 2.

When the pod transport device 118 is connected to the uppermost pod 110 of the rotatable pod shelf 105, the extra-shelf 131 serving as an upper buffer shelf is controlled by the operation controller 237 so as to move from the upper retreat position (the "home position" described with reference to FIGS. 8A and 8B) to the lower position only when the pod 110 is delivered.

Two extra-shelves 131 are arranged on the L-side and the R-side and are controlled by the operation controller 237 so that while the pod transport device 118 gains access to one of the L-side and R-side extra-shelves 131, the other of the L-side and R-side extra-shelves 131 is held in the upper retreat position (home position). Likewise, two sub-shelves 132 are arranged on the L-side and the R-side and are controlled by the operation controller 237 so that while the pod transport device 118 gains access to one of the L-side and R-side sub-shelves 132, the other of the L-side and R-side sub-shelves 132 is held in the initial position (home position). When the transport of the pod 110 to and from the pod transport device 118 is not carried out, the placement part 132a of the sub-shelf 132 is held in the home position.

Thus, the extra-shelves 131 and the sub-shelves 132 may be added to the substrate processing apparatus 100 without interfering with the transport of the pod 110 among between the loading port shelf 114, the rotatable pod shelf 105 and the pod opener 121. Since the movable shelves 131 and 132 are independent operation mechanisms separated one by one, it is possible to secure the degree of freedom in combining the number of buffer shelves for accommodating the pods 110.

Even if the extra-shelves 131 and the sub-shelves 132 are further provided, when delivering the pod 110 between each of the extra-shelves 131 and the sub-shelves 132 and the pod transport device 118, it is possible to deliver the pod 110 without moving the arm of the pod transport device 118 kept in the initial position state. Therefore, it is possible to shorten the teaching operation as compared with the conventional transfer sequence for operating the arm.

The teaching operation for realizing the transfer sequence according to the embodiment may be the teaching on four points of the delivery retreat position, the pre-delivery position, the post-delivery position and the delivery standby position with respect to the pod transport device 118, and may be the teaching on two points of the delivery position and the home position (initial position) with respect to the movable shelves 131 and 132 (the home position may be unnecessary). Therefore, the time required for the teaching operation can be shortened as compared with the conventional transfer sequence according to the comparative example shown in FIG. 7.

That is, according to the conventional transfer sequence, as shown in the comparative example of FIG. 7, not only the operation of the arm of the pod transport mechanism 118b needs to be taken into account, but also the area for performing carrying the transport needs to be secured.

Particularly, according to the conventional transfer sequence, teaching has to be performed with respect to the extra-shelf 131 by taking the operation of the arm of the pod transport mechanism 118b into account. Thus, the teaching is not easy and it is difficult to secure the area for performing the transport of the pod 110. In this case, a large-scale modification accompanied by a design change is required, which is time-consuming and expensive.

By improving the transfer sequence according to the embodiment, the operation mechanisms other than the movable shelves 131 and 132 can be used in common with the substrate processing apparatus 100 shown in FIG. 2. Therefore, the housing 111, the loading port shelves 114, the pod transport device 118 and the rotatable pod shelf 105 may be kept in an existing state and, therefore, may be used in common with the delivery-completed substrate processing apparatus 100. In particular, since it is not necessary to change the moving stroke of the pod elevator 118a of the pod transport device 118, there is no need to remove and separately transport the pod elevator 118a at the time of transporting the apparatus. This makes it possible to shorten the setup time on the spot.

According to the embodiment, the extra-shelf 131 and the sub-shelf 132 need to be newly designed. In addition, it is necessary to improve the software for executing the transfer sequence according to the embodiment. In other words, it is only necessary to consider the modification required for adding the extra-shelf 131 and the sub-shelf 132, and the time and cost required therefor. As described above, according to the embodiment, the movable shelves 131 and 132 can be added through the small-scale modification of the delivery-completed substrate processing apparatus 100.

Accordingly, it is only necessary to perform the modification required for the addition and removal of the movable shelves 131 and 132. Therefore, even if the number of the pods 110 to be accommodated in the substrate processing apparatus 100 is increased or decreased, it is possible to suppress the number of steps and the cost for the modification to a relatively low level.

Although the embodiment has been described on the basis of the case of "adding" the operation mechanisms, the embodiment may also be applied to the case of "removing" the operation mechanisms.

According to the embodiment, the operation mechanisms other than the movable shelves can be used in common with the conventional substrate processing apparatus. Therefore, it is possible to greatly reduce the burden due to the reassembly and readjustment at the customer's factory (on the spot).

The embodiment has been described on the basis of an example in which the placement parts of the movable shelves are moved vertically or horizontally. However, the above-described technique is not limited thereto. For example, the above-described technique is applicable to any form as long as the pod 110 can be moved to the movable region of the pod transport device 118 by moving the placement part. That is, the above-described technique is applicable to any configuration as long as the arm of the pod transport device 118 can be moved to the position where the pod 110 can be delivered, in a state in which the arm of the pod transport device 118 is fixed in the initial position without extending or contracting the arm.

<Effects According to the Embodiment>

According to the embodiment, one or more advantageous effects described below are provided.

(a) According to the embodiment, by using the improved transfer sequence to deliver the pod between the movable shelves and the pod transport device, the operation mechanisms other than the movable shelves can be used in common with the conventional substrate processing apparatus. Therefore, the movable shelves can be easily added to the delivery-completed apparatus. This makes it possible to reduce the cost required for the modification of the apparatus.

(b) According to the embodiment, the operation mechanisms other than the movable shelves can be used in common with the conventional substrate processing apparatus. Therefore, it is possible to reduce the cost required for the modification of the apparatus and to greatly reduce the burden due to the reassembly and readjustment at the customer's factory (on the spot).

(c) According to the embodiment, there is no need to change the moving stroke of the pod elevator 118a of the pod transport device 118. Therefore, the pod elevator 118a does not need to be removed and transported separately at the time of transporting the apparatus. This makes it possible to shorten the setup time on the spot.

(d) According to the embodiment, the operation mechanisms other than the movable shelves can be used in common with the conventional substrate processing apparatus. Therefore, it is possible to reduce the setup work load before carrying out the transfer sequence of the movable shelves and the pod transport device and to shorten the setup time on the spot.

(e) According to the embodiment, by adopting the transfer sequence of the movable shelves and the pod transport device, it is possible to relatively easily unitize the movable shelves and to secure the degree of freedom in combining the number of buffer shelves for accommodating the pods.

(f) According to the embodiment, the movable shelves are composed of independent units separated one by one. Therefore, it is possible to secure the degree of freedom in combining the number of buffer shelves for accommodating the pods. Thus, even when the number of wafers 200 to be processed is changed and the apparatus is required to be modified, it is possible to cope with such a situation in a short time.

While the technique is described by way of the above-described embodiment and examples, the above-described technique is not limited thereto. The above-described technique may be modified in various ways without departing from the gist thereof.

While HCDS gas is exemplified as the source gas according to the embodiment, the above-described technique is not limited thereto. Instead of the HCDS gas, for example, an inorganic silane source gas free of halogen such as monosilane ($SiH_4$, abbreviated as MS) gas, disilane ($Si_2H_6$, abbreviated as DS) gas and trisilane ($Si_3H_8$, abbreviated as TS) gas may be used as the source gas. Instead of the HCDS gas, for example, an inorganic halosilane source gas such as monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane gas, that is, silicon tetrachloride ($SiCl_4$, abbreviated as STC) gas and octachlorotrisilane ($Si_3Cl_8$, abbreviated as OCTS) gas may be used as the source gas. Instead of the HCDS gas, for example, an amino-based (amine-based) silane source gas free of halogen such as trisdimethylaminosilane ($Si[N(CH_3)_2]_3H$, abbreviated as 3DMAS) gas, tetrakisdimethylaminosilane ($Si[N(CH_3)_2]_4$, abbreviated as 4DMAS) gas, bisdiethylaminosilane ($Si[N(C_2H_5)_2]_2H_2$, abbreviated as BDEAS) gas and bis(tertiary-butyl amino)silane gas ($SiH_2[NH(C_4H_9)]_2$, abbreviated as BTBAS) gas may also be used as the source gas.

While $NH_3$ gas is exemplified as the reactive gas according to the embodiment, the above-described technique is not limited thereto. Instead of the $NH_3$ gas, for example, a hydrogen nitride-based gas such as diazene ($N_2H_2$) gas, hydrazine ($N_2H_4$) gas, $N_3H_8$ gas and compounds thereof may be used as the reactive gas. Instead of the $NH_3$ gas, for example, an ethylamine-based gas such as triethylamine (($C_2H_5$)$_3$N, abbreviated as TEA) gas, diethylamine (($C_2H_5$)$_2$NH, abbreviated as DEA) gas and monoethylamine ($C_2H_5NH_2$, abbreviated as MEA) gas may also be used as the reactive gas. Instead of the $NH_3$ gas, for example, a methylamine-based gas such as trimethylamine (($CH_3$)$_3$N, abbreviated as TMA) gas, dimethylamine (($CH_3$)$_2$NH, abbreviated as DMA) gas and monomethylamine ($CH_3NH_2$, abbreviated as MMA) may also be used as the reactive gas.

While the above-described embodiment is described based on forming a film containing silicon (Si) such as a silicon nitride film (SiN film), the above-described technique is not limited thereto. For example, the above-described technique may be applied to the formations of a metal-based film, that is, a film containing a metal element such as titanium (Ti), zirconium (Zr), hafnium (Hf), tantalum (Ta), niobium (Nb), aluminum (Al), molybdenum (Mo) and tungsten (W).

That is, the above-described technique may be preferably applied to a formation of a film containing a predetermined element such as a semiconductor element and a metal element.

While the embodiment is described by way of an example in which the film is deposited on the wafers 200, the above-described technique is not limited thereto. For example, the above-described technique may be preferably applied to the processes such as an oxidation process, a diffusion process, an annealing process and an etching process of the wafers 200 or the film formed on the wafers 200.

While the above-described embodiment is described based on the batch type vertical apparatus serving as the substrate processing apparatus, the above-described technique is not limited thereto. For example, a batch type horizontal apparatus capable of batch processing may be used as the substrate processing apparatus.

The above-described technique is not limited to the substrate processing apparatus according to the embodiment configured to process semiconductor wafer. The above-described technique may also be applied to an apparatus such as an LCD (Liquid Crystal Display) manufacturing apparatus configured to process glass substrate.

The above-described technique may be applied to a substrate processing apparatus capable of being modified as the number of product substrates to be processed is changed.

According to the technique described herein, it is possible to reduce the burden of modifying the apparatus as the number of product substrates to be processed is changed.

What is claimed is:

1. A substrate processing apparatus comprising:
   a transport mechanism comprising a support where a substrate container is placed, an elevating mechanism configured to raise or lower the support, and an extending/contracting part configured to move the support by being extended or contracted;
   a storage part comprising a placement part where the substrate container is placed and a driving part configured to raise or lower the placement part away from or into a movable region of the support; and
   a controller configured to control the transport mechanism and the storage part such that the substrate container is delivered between the support and the placement part by the driving part raising or lowering the placement part from outside of the movable region of the support into the movable region of the support,
   wherein the substrate container is delivered between the support and the storage part while the support is held in an initial position wherein the extending/contracting part is contracted.

2. The substrate processing apparatus of claim 1, wherein the controller is further configured to transfer the substrate container away from or into the movable region of the support by vertically driving the placement part.

3. The substrate processing apparatus of claim 2, wherein the storage part is configured to deliver the substrate container to the transport mechanism by vertically driving the placement part.

4. The substrate processing apparatus of claim 1, wherein the storage part is disposed at an upper portion of the movable region of the support when the placement part is in a home position.

5. The substrate processing apparatus of claim 4, wherein the storage part is configured to deliver the substrate container to the transport mechanism by vertically driving the placement part.

6. The substrate processing apparatus of claim 1, wherein the placement part comprises first projections configured to support the substrate container at a plurality of points, and
   the support comprises second projections configured to support the substrate container at a plurality of points.

7. The substrate processing apparatus of claim 1, wherein the placement part comprises a sensor configured to detect whether the substrate container is placed thereon.

8. The substrate processing apparatus of claim 1, wherein the controller is further configured to control the transport mechanism and the placement part such that the support is transferred to a delivery position with the placement part being transferred into the movable region of the support.

9. A substrate processing apparatus of claim 1 comprising:
   a transport mechanism comprising a support where a substrate container is placed and an elevating mechanism configured to raise or lower the support;
   a storage part comprising a placement part where the substrate container is placed and a driving part configured to raise or lower the placement part away from or into a movable region of the support; and a controller configured to control the transport mechanism and the storage part such that the substrate container is delivered between the support and the placement part by the driving part raising or lowering the placement part from outside of the movable region of the support into the movable region of the support, wherein the storage part comprises a notch portion configured to prevent the support from interfering with the placement part when the transport mechanism raises the substrate container by the support or when the transport mechanism lowers the substrate container to the placement part.

10. The substrate processing apparatus of claim 9, wherein the notch portion is larger in cross-sectional area than the support.

11. The substrate processing apparatus of claim 9, wherein the notch portion is larger in cross-sectional area than the placement part.

12. A substrate processing apparatus comprising:
a transport mechanism comprising a support where a substrate container is placed and an elevating mechanism configured to raise or lower the support;
a storage part comprising a placement part where the substrate container is placed and a driving part configured to raise or lower the placement part away from or into a movable region of the support; and
a controller configured to control the transport mechanism and the storage part such that the substrate container is delivered between the support and the placement part by the driving part raising or lowering the placement part from outside of the movable region of the support into the movable region of the support,
wherein the controller is further configured to control to: move the placement part to a delivery position in which the substrate container is capable of being delivered; move the transport mechanism down below or up above the delivery position; and move the transport mechanism to a delivery retreat position after receiving the substrate container from the placement part or delivering the substrate container to the placement part.

13. The substrate processing apparatus of claim 12, wherein the controller is further configured to control to: move the transport mechanism to a delivery retreat position; and return the placement part to a home position.

14. The substrate processing apparatus of claim 1, wherein the controller is further configured to control the support and the placement part such that the substrate container is delivered therebetween by raising or lowering the transport mechanism while the support remains stationary without the extending/contracting part being extended or contracted.

15. The substrate processing apparatus of claim 14, wherein the controller is further configured to control to: move the placement part to a delivery position in which the substrate container is capable of being delivered; move the transport mechanism down below or up above the delivery position; and move the transport mechanism to a delivery retreat position after receiving the substrate container from the placement part or delivering the substrate container to the placement part.

16. A substrate processing apparatus comprising:
a housing divided into a process region where a substrate is processed and a transfer region where a substrate container is transferred from the process region;
a loading/unloading port via which the substrate container is loaded or unloaded;
a rotatable storage part where the substrate container is stored;
a transport mechanism comprising a support where the substrate container is placed and an elevating mechanism configured to raise or lower the support;
a storage part comprising a placement part where the substrate container is placed and a driving part configured to raise or lower the placement part away from or into a movable region of the support; and
a controller configured to control the transport mechanism and the storage part such that the substrate container is delivered between the support and the placement part by the driving part raising or lowering the placement part from outside of the movable region of the support into the movable region of the support,
wherein at least one among the loading/unloading port and the rotatable storage part is capable of delivering the transport mechanism and the substrate container into the transfer region disposed between the loading/unloading port and the rotatable storage part, and
the transport mechanism moves the support by the extending/contracting part and delivers the substrate container between the transport mechanism and the loading/unloading port or between the transport mechanism and the rotatable storage part.

17. A method of manufacturing a semiconductor device using a substrate processing apparatus comprising a transport mechanism comprising a support where a substrate container is placed, an elevating mechanism configured to raise or lower the support and an extending/contracting part configured to move the support by being extended or contracted; and a storage part comprising a placement part where the substrate container is placed and a driving part configured to raise or lower the placement part away from or into a movable region of the support, the method comprising:
delivering the substrate container between the support and the placement part by the driving part raising or lowering the placement part from outside of the movable region of the support into the movable region of the support; and
delivering the substrate container between the support and the storage part while the support is held in an initial position wherein the extending/contracting part is contracted.

18. A non-transitory computer-readable recording medium storing a program used for a substrate processing apparatus comprising a transport mechanism comprising a support where a substrate container is placed, an elevating mechanism configured to raise or lower the support, and an extending/contracting part configured to move the support by being extended or contracted; a storage part comprising a placement part where the substrate container is placed and a driving part configured to raise or lower the placement part away from or into a movable region of the support; and a controller configured to control the transport mechanism and the driving part, the program causing the controller to perform:
delivering the substrate container between the support and the placement part by the driving part raising or lowering the placement part from outside of the movable region of the support into the movable region of the support; and
delivering the substrate container between the support and the storage part while the support is held in an initial position wherein the extending/contracting part is contracted.

* * * * *